(12) United States Patent
Chiu et al.

(10) Patent No.: US 12,723,311 B2
(45) Date of Patent: Sep. 1, 2026

(54) DUAL AMPOULE SEPARATOR PLATE AND METHOD

(71) Applicant: Taiwan Semiconductor Manufacturing Company, Ltd., Hsinchu (TW)

(72) Inventors: Chi-Wen Chiu, Hsinchu (TW); Chih-Chang Wu, Hsinchu City (TW); Che-Wei Tung, Hsinchu (TW); Chiang Hsien Shih, Hsinchu (TW); Chin-Szu Lee, Taoyuan City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 652 days.

(21) Appl. No.: 17/651,112

(22) Filed: Feb. 15, 2022

(65) Prior Publication Data

US 2023/0019511 A1 Jan. 19, 2023

Related U.S. Application Data

(60) Provisional application No. 63/222,860, filed on Jul. 16, 2021.

(51) Int. Cl.

*C23C 16/448* (2006.01)
*C23C 16/455* (2006.01)
*H10P 72/00* (2026.01)

(52) U.S. Cl.

CPC .... *C23C 16/4481* (2013.01); *C23C 16/45561* (2013.01); *H10P 72/0602* (2026.01)

(58) Field of Classification Search

CPC .............. C23C 16/448; C23C 16/4481; C23C 16/4482; C23C 16/4483; C23C 16/4485; C23C 16/4486; C23C 16/4487; C23C 16/45561; H01J 37/3244; H01J 37/32449; H10P 72/0602

See application file for complete search history.

(56) References Cited

U.S. PATENT DOCUMENTS 4,189,619 A * 2/1980 Pedlow ................ H02G 3/0412 106/18.36
4,625,949 A * 12/1986 Walker .................... B62B 1/264 280/47.26
4,899,968 A * 2/1990 Eaglin ........................ A47F 5/02 248/131
6,059,127 A * 5/2000 Bennett ................... B62B 3/104 211/85.18
6,116,623 A * 9/2000 Salvucci ................. B62B 1/264 280/79.5

(Continued)

OTHER PUBLICATIONS

Ebert, et al. "Intercomparison of thermal conductivity measurements on a calcium silicate insulation material". Int'l J. Therm. Sci. 50 (2011) 1838-1844. (Year: 2011).*

*Primary Examiner* — Kurt Sweely

(74) *Attorney, Agent, or Firm* — Harrity & Harrity, LLP

(57) ABSTRACT

A system and method for reducing thermal transfer in a dual ampoule system. The dual ampoule system includes a first ampoule, a second ampoule, and a planar heat shield. The planar heat shield is positioned between the first ampoule and the second ampoule, where the planar heat shield is configured to resist thermal transfer between the first ampoule and the second ampoule.

20 Claims, 16 Drawing Sheets

(56) References Cited

U.S. PATENT DOCUMENTS

| | | | | |
|---|---|---|---|---|
| 6,406,519 | B1 * | 6/2002 | Tom | F17C 7/00 95/902 |
| 7,252,297 | B1 * | 8/2007 | Barritt | B23K 7/10 280/79.5 |
| 7,628,407 | B1 * | 12/2009 | Krowl | B62B 1/264 280/79.5 |
| 11,004,707 | B1 * | 5/2021 | Kilpi | C23C 16/511 |
| 2015/0176153 | A1 * | 6/2015 | Chang | C23C 16/448 137/487 |
| 2019/0203358 | A1 * | 7/2019 | Babayan | C23C 16/52 |
| 2020/0359773 | A1 * | 11/2020 | Boyd | A45F 3/14 |

* cited by examiner

108

DUAL AMPOULE SEPARATOR PLATE AND METHOD

CROSS-REFERENCE TO RELATED APPLICATION

This patent application claims priority to U.S. Provisional Patent Application No. 63/222,860, filed on Jul. 16, 2021, and entitled "SEPARATOR PLATE." The disclosure of the prior application is considered part of and is incorporated by reference into this patent application.

BACKGROUND

Chemical vapor deposition (CVD) is a chemical process used in the semiconductor industry to produce thin films. In CVD, a semiconductor wafer (substrate) is exposed to one or more volatile precursors, which react and/or decompose on the substrate surface to produce the thin film. As the geometries of features on the semiconductor wafer are reduced, more complex CVD processes may be required to obtain operational circuits at the reduced feature size. The complex CVD processes may rely on processes performed in vacuums and with tools that may also be more complex and compact.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
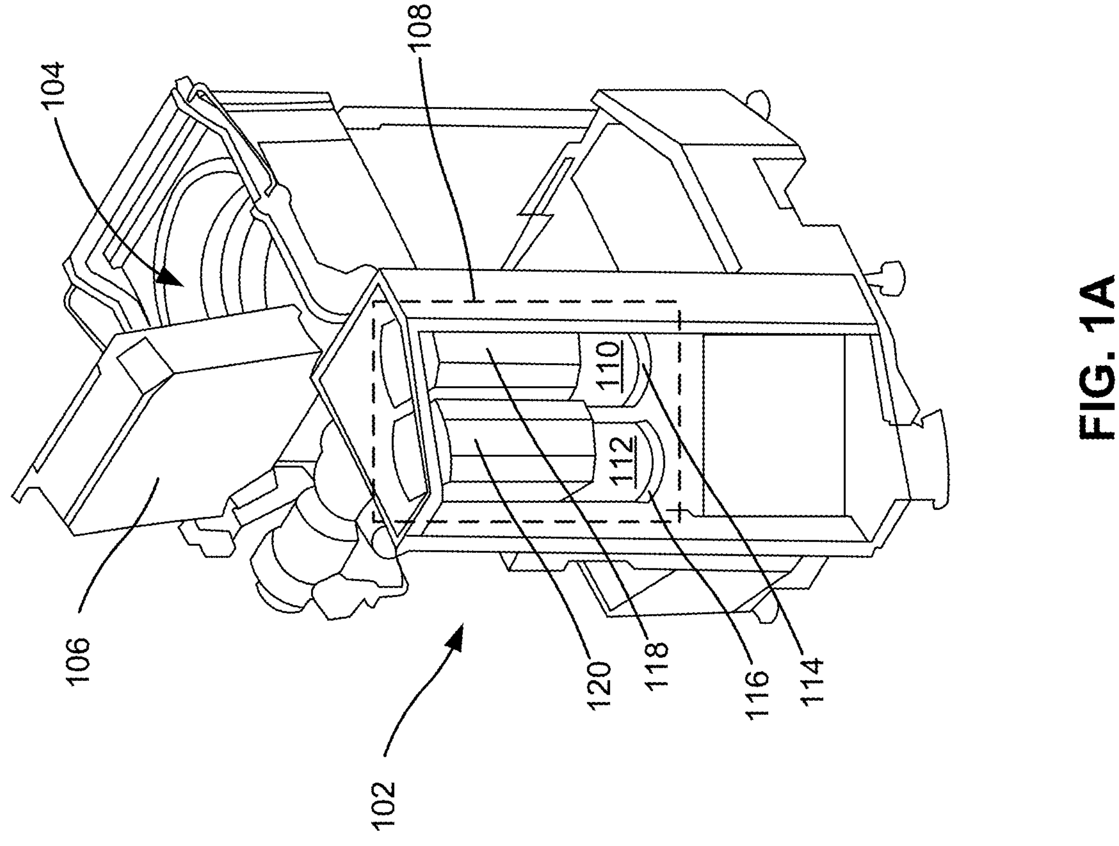
FIG. 1A is a diagram of a perspective view of an example deposition system described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A deposition system is a semiconductor processing tool configured to deposit various types of materials onto a substrate. The deposition system includes a chemical vapor deposition (CVD) tool such as a plasma-enhanced CVD (PECVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. A deposition system can include a physical vapor deposition (PVD) tool, such as a sputtering tool or another type of PVD tool.

Semiconductor wafer processing techniques employ processes for which precursors are stored and/or processed at different temperatures. For example, a deposition process (e.g., a CVD process or an ALD process) may be performed using tools that include adjacent precursor ampoules (e.g., dual ampoules) configured to store different liquid and/or solid precursors at different temperatures. These adjacent precursor ampoules may include respective controllers and sensors for maintaining the specific temperatures for the corresponding precursor ampoules.

In operation, a temperature differential between the respective temperatures of the adjacent precursor ampoules may result in the transfer of heat between the adjacent precursor ampoules by convection. This transfer of heat may interfere with adjacent sensors and controllers and cause undesirable temperature fluctuations which may also be referred to as "temperature vibration." Such temperature fluctuations may result in inaccurate temperature adjustments in one or more of the adjacent precursor ampoules, causing the ongoing manufacturing process to fail (which may reduce semiconductor processing yield). For example, the temperature fluctuations may cause the deposition system to form deposition layers on the semiconductor wafer that are either too thick or too thin to result in operable structures. Moreover, these temperature fluctuations may result in an increased power consumption of cooling and/or heating components associated with the adjacent precursor ampoules to mitigate the temperature fluctuations.

Some implementations described herein provide a deposition system that includes a separator plate between a first ampoule and a second ampoule (referred to collectively as adjacent ampoules) to reduce convection transfer between the first ampoule and the second ampoule. The deposition system may be used in processes including, for example, a backend of line (BEOL) fabrication process using the first ampoule that operates at a first ampoule target temperature, and the second ampoule that operates at a second ampoule target temperature. These processes may include, for example, a barrier seed process, a CVD process, or another type of deposition process in which a plurality of precursors are provided to a processing chamber of the deposition system. The first ampoule target temperature, of the first ampoule, is greater than the second ampoule target temperature of the second ampoule. Thus, placement of the separator plate between the first ampoule and the second ampoule reduces convection transfer between the first ampoule and the second ampoule, which reduces temperature variation (or temperature fluctuation) at a controller for the first ampoule and the second ampoule. The reduction in temperature variation results in greater semiconductor device yields and improved circuit performance on the semiconductor devices. Moreover, the reduction in temperature variation may reduce power consumption of cooling and/or heating components associated with the adjacent ampoules.

Figure 1B:
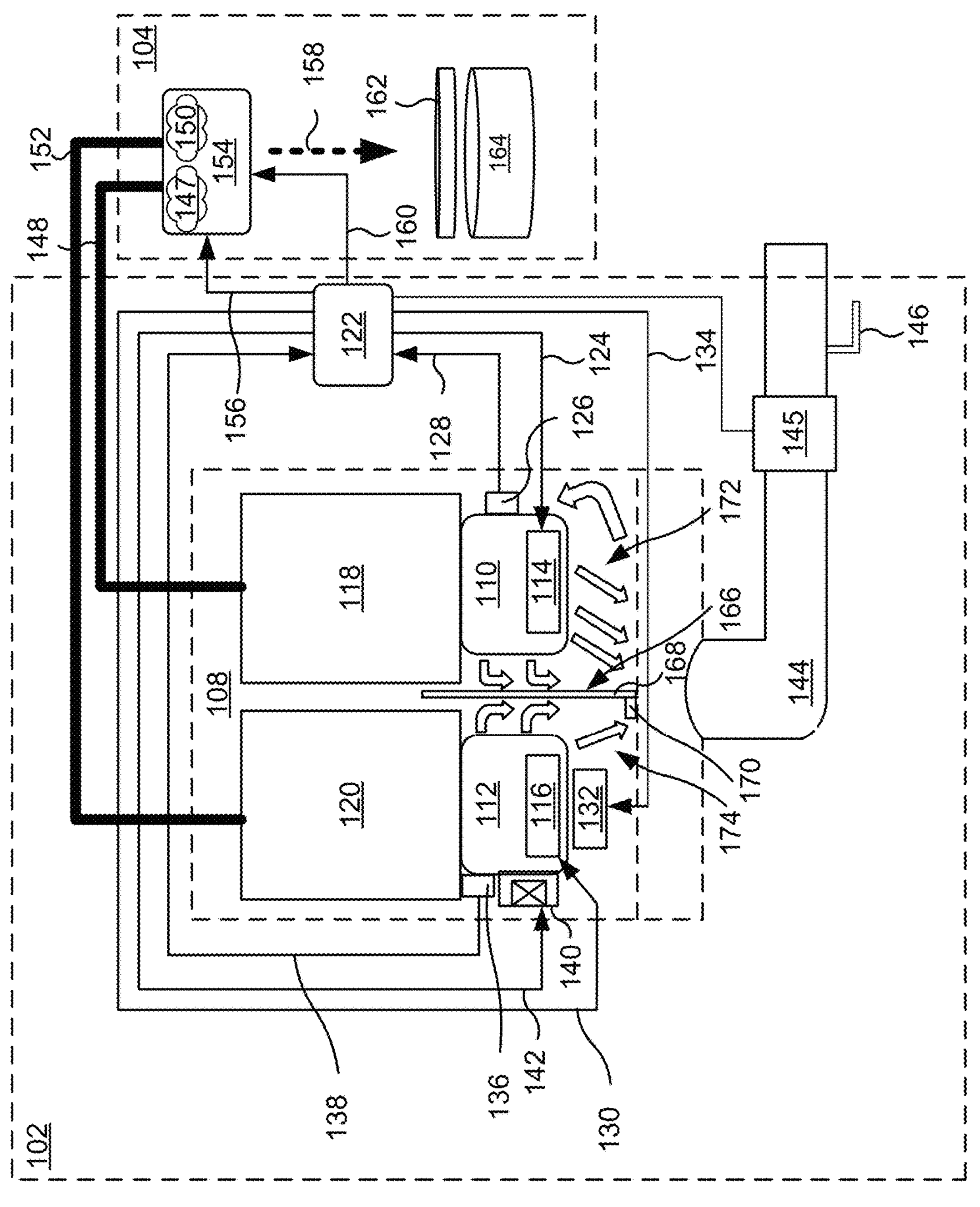
FIG. 1B is a block diagram of the example deposition system of FIG. 1A.

FIGS. 1A and 1B are diagrams of an example deposition system 100 described herein. In particular, FIGS. 1A and 1B illustrate an example of a deposition system 100 that includes a compact arrangement of closely-positioned ampoules that are configured to generate precursor gasses for use in the deposition system 100. FIGS. 1A and 1B illustrate the proximity and spatial arrangement of the various components of the deposition system 100.

FIG. 1A is a diagram of a perspective view of the deposition system 100. The deposition system 100 may perform, for example, a barrier layer process or another type of deposition process on a semiconductor wafer. Examples of the deposition system 100 include a CVD tool such as a PECVD tool, an HDP-CVD tool, an SACVD tool, an ALD tool, a PEALD tool, or another type of CVD tool. Example deposition processes performed by the deposition system 100 include a seed layer deposition process, a barrier layer deposition process, and/or another type of deposition process. The deposition system 100 includes a dual ampoule system 102 and a processing chamber 104 including a lid 106. The dual ampoule system 102 generates one or more precursor gasses (or precursor vapors), one or more carrier gasses, and/or one or more other types of gasses for use in a deposition process associated with one or more semiconductor wafers in the processing chamber 104. The lid 106 provides access to the processing chamber 104 to load and unload semiconductor wafers into and out of the processing chamber 104. The lid 106 also provides access to the processing chamber 104 to accommodate cleaning and maintenance within the processing chamber 104. The lid 106 may also house components to mix precursor gasses in the processing chamber 104.

The dual ampoule system 102 includes a dual ampoule assembly 108. The dual ampoule assembly 108 is configured to generate one or more precursor gasses for use in a deposition process. The dual ampoule assembly 108 includes a first ampoule 110 and a second ampoule 112. The first ampoule 110 is physically adjacent to the second ampoule 112. In an example, the first ampoule 110 and the second ampoule 112 are separated by a distance that is in a range of approximately 5 millimeters (mm) to approximately 15 mm. However, other values for the distance are also within the scope of the present disclosure.

An ampoule (e.g., the first ampoule 110 and/or the second ampoule 112) includes a container configured to store a liquid or a solid precursor. The ampoule is further configured to heat the precursor to vaporize the precursor, which results in the generation of a precursor gas (or precursor vapor) for use in a deposition process. In some implementations, the first ampoule 110 includes (e.g., stores and/or processes) a first precursor for generating a first precursor gas, and the second ampoule 112 includes (e.g., stores and/or processes) a second precursor for generating a second precursor gas.

The dual ampoule assembly 108 further includes a first ampoule heating element 114. The first ampoule heating element 114 may include a resistive heating element or another type of conductive heating device. The first ampoule heating element 114 is configured to generate heat to cause a temperature at the first ampoule 110 to achieve, satisfy, or reach a first ampoule target temperature. The dual ampoule assembly 108 further includes a second ampoule heating element 116. The second ampoule heating element 116 may include a resistive heating element or another type of conductive heating device. The second ampoule heating element 116 is configured to generate heat to cause a temperature at the second ampoule 112 to achieve, satisfy, or reach a second ampoule target temperature.

The first ampoule target temperature causes generation of the first precursor gas from the first precursor. In other words, the first ampoule target temperature may be approximately equal to or greater than a temperature at which the first precursor transitions from a solid or a liquid to a gas or a vapor. Further, the second ampoule target temperature causes generation of the second precursor gas from the second precursor. In other words, the second ampoule target temperature may be approximately equal to or greater than a temperature at which the second precursor transitions from a solid or a liquid to a gas or a vapor.

In some implementations, the dual ampoule assembly 108 further includes a first hot can 118 located above and coupled to the first ampoule 110. The dual ampoule assembly 108 further includes a second hot can 120 located above and coupled to the second ampoule 112. The first hot can 118 and the second hot can 120 respectively surround valves and gas lines associated with gas inlets and outlets to the respective first ampoule 110 and the second ampoule 112. The first hot can 118 and the second hot can 120 provide a heated environment for the valves and the gas lines to reduce condensation in the valves and the gas lines as a result of an ambient temperature around the deposition system 100.

FIG. 1B is a block diagram of the example deposition system 100 of FIG. 1A. As described, the deposition system 100 includes the dual ampoule system 102 and the processing chamber 104. The dual ampoule system 102 includes the dual ampoule assembly 108 including the first ampoule 110 and the second ampoule 112. The dual ampoule assembly 108 may include the first hot can 118 and the second hot can 120.

In some implementations, the dual ampoule system 102 includes a controller 122. The controller 122 is a processor for carrying out programmed operations. The controller 122 is configured to operate one or more components of the deposition system 100. In some implementations, the controller 122 provides one or more signals indicative of a first ampoule temperature setpoint associated with the first ampoule 110 and a second ampoule temperature setpoint associated with the second ampoule 112.

In some implementations, the controller 122 provides an indication of the first ampoule temperature setpoint in a first ampoule control signal 124 to the first ampoule heating element 114 in the first ampoule 110. The first ampoule control signal 124 includes a voltage, a current, a resistance, a digital communication, or another type of indication of the first ampoule temperature setpoint. For example, the controller 122 provides the first ampoule control signal 124 to cause the first ampoule heating element 114 of the first ampoule 110 to generate heat based on the first ampoule temperature setpoint associated with the first ampoule 110. The first ampoule heating element 114 generates heat at the first ampoule 110 to cause a temperature at the first ampoule 110 to achieve, satisfy, or reach the first ampoule target temperature based on the first ampoule temperature setpoint. The heat is generated in an amount to cause the first precursor to be heated to the first ampoule target temperature to generate the first precursor gas. The first ampoule target temperature is based on a volatility temperature of the first precursor used in the first ampoule 110. The volatility temperature is a temperature at which a material in a non-gaseous state transitions to a gaseous state or vapor.

In some implementations, the controller 122 is configured to receive first ampoule sensor data associated with a first ampoule ambient temperature measured at the first ampoule 110. The dual ampoule system 102 includes a first ampoule temperature sensor 126 associated with the first ampoule 110 and configured to generate the first ampoule sensor data. The first ampoule temperature sensor 126 may include a thermocouple, a thermistor, an infrared (IR) sensor, a resistive temperature device (RDT), or another type of temperature sensor coupled to, integrated with, or otherwise associated with the first ampoule 110. In operation, the first ampoule temperature sensor 126 senses (e.g., measures or detects) the first ampoule ambient temperature at the first ampoule 110 and provides the first ampoule ambient temperature as the first ampoule sensor data. The first ampoule sensor data may include a voltage, a current, a resistance, a digital communication, or another type of indication of the first ampoule ambient temperature. The controller 122 receives an indication of the first ampoule sensor data in a first ampoule sensor signal 128. The controller 122 compares the first ampoule sensor data and the first ampoule target temperature. Based on a result of the comparison, the controller 122 adjusts the first ampoule temperature setpoint to cause the first ampoule ambient temperature at the first ampoule 110 to achieve, satisfy, or reach the first ampoule target temperature.

In some implementations, the controller 122 provides an indication of the second ampoule temperature setpoint in a second ampoule control signal 130 to the second ampoule heating element 116 in the second ampoule 112. The second ampoule control signal 130 includes a voltage, a current, a resistance, a digital communication, or another type of indication of the second ampoule temperature setpoint. For example, the controller 122 provides the second ampoule control signal 130 to cause the second ampoule heating element 116 of the second ampoule 112 to generate heat based on the second ampoule temperature setpoint associated with the second ampoule 112. The second ampoule heating element 116 generates heat at the second ampoule 112 to cause a temperature at the second ampoule 112 to achieve, satisfy, or reach the second ampoule target temperature based on the second ampoule temperature setpoint. The heat is generated in an amount to cause the second precursor to be heated to the second ampoule target temperature to generate the second precursor gas. The second ampoule target temperature is based on a volatility temperature of the second precursor used in the second ampoule 112. As described, the volatility temperature is a temperature at which a material in a non-gaseous state transitions to a gaseous state or vapor.

In some implementations, the dual ampoule assembly 108 includes a cooling element 132. In an example, the cooling element 132 includes a thermoelectric cooler such as a Peltier cooling device, or another type of cooling device. The cooling element 132 is configured to cool the second ampoule 112 to reduce the temperature of the second ampoule 112. The controller 122 may control the cooling element 132 to maintain the second ampoule 112 at the second ampoule target temperature. The controller 122 generates a cooling element control signal 134 that is used to maintain the second ampoule 112 at the second ampoule target temperature or to reduce the temperature of the second ampoule 112 to the second ampoule target temperature. The cooling element control signal 134 includes a voltage, a current, a resistance, a digital communication, or another type of indication of the second ampoule target temperature. For example, the controller 122 provides the cooling element control signal 134 to the cooling element 132 to cause the cooling element 132 of the second ampoule 112 to cool the second ampoule 112 based on the second ampoule target temperature. The cooling element 132, in response to the cooling element control signal 134, absorbs heat at the second ampoule 112 to cause a temperature at the second ampoule 112 to achieve, satisfy, or reach the second ampoule target temperature.

In some implementations, the controller 122 is configured to receive second ampoule sensor data associated with a second ampoule ambient temperature measured at the second ampoule 112. The dual ampoule system 102 includes a second ampoule temperature sensor 136 associated with the second ampoule 112 and configured to generate the second ampoule sensor data. The second ampoule temperature sensor 136 may include a thermocouple, a thermistor, an IR sensor, an RDT, or another type of temperature sensor coupled to, integrated with, or otherwise associated with the second ampoule 112. In operation, the second ampoule temperature sensor 136 senses (e.g., measures or detects) a second ampoule ambient temperature at the second ampoule 112 and provides the second ampoule ambient temperature as the second ampoule sensor data. The second ampoule sensor data may include a voltage, a current, a resistance, a digital communication, or another type of indication of the second ampoule ambient temperature. The controller 122 receives an indication of the second ampoule sensor data in a second ampoule sensor signal 138. The controller 122 compares the second ampoule sensor data and the second ampoule target temperature. Based on a result of the comparison, the controller 122 adjusts the second ampoule temperature setpoint to cause the second ampoule ambient temperature at the second ampoule 112 to achieve, satisfy, or reach the second ampoule target temperature.

In some implementations, the dual ampoule assembly 108 includes a fan 140. In some implementations, the fan 140 may be a variable speed fan where a speed is configurable based on a control signal. In some implementations, the fan 140 may be a single speed fan where the fan 140 may be activated or deactivated based on a control signal. The fan 140 may be positioned within the dual ampoule assembly 108 adjacent to the first ampoule 110 and/or the second ampoule 112. The fan 140 is configurable to provide airflow within the dual ampoule assembly 108. The controller 122 provides a fan control signal 142 to the fan 140. In response to the fan control signal 142, the fan 140 operates and provides airflow around the second ampoule 112 and/or the first ampoule 110. The fan control signal 142 includes a voltage, a current, a resistance, a digital communication, or another type of control signal.

The dual ampoule system 102 further includes an exhaust line 144 configured to allow the airflow generated by the fan 140 to exit the dual ampoule system 102. In some implementations, the exhaust line 144 is located below and between the first ampoule 110 and the second ampoule 112 to enable the airflow around the first ampoule 110 and/or the second ampoule 112 to be selectively exhausted through the exhaust line 144. A fan speed sensor 145 may be positioned in-line in the exhaust line 144 such that the fan speed sensor 145 is configured to generate sensor data associated with airflow through the exhaust line 144 and to provide the sensor data to the controller 122. The controller 122 may receive the sensor data and may use a control valve 146 to adjust the airflow through the exhaust line 144 (e.g., to increase the airflow, to decrease the airflow) based on the sensor data.

The first ampoule 110 generates a first precursor gas 147 that is provided through a first gas line 148 to the processing chamber 104. The second ampoule 112 generates a second precursor gas 150 that is provided through a second gas line 152 to the processing chamber 104. In some implementations, the first ampoule 110 and the second ampoule 112 are operated to concurrently generate the first precursor gas 147 and the second precursor gas 150, respectively. In some implementations, the first precursor gas 147 includes a ruthenium (Ru) precursor. In some implementations, the ruthenium (Ru) precursor includes $\eta^4$-2,3-dimethylbutadiene ruthenium tricarbonyl ($Ru(DMBD)(CO)_3$) and/or another ruthenium precursor. In some implementations, the second precursor gas 150 includes a tantalum nitride (TaN) precursor. In some implementations, the tantalum nitride (TaN) precursor includes other tantalum precursors such as tert-butylimidotris(diethylamido)tantalum [$(^tBuN)(NEt_2)_3Ta$, TBTDET], ammonia ($NH_3$), $Ta(NEt_2)_2Cl_2(p\text{-}Me_2Npy)_2$, and/or $Ta(NEt_2)_2(NCy_2)_2$, among other examples. The types of precursors identified above are intended as examples of precursors that could be used and other types of precursors may be used in the deposition system 100.

In some implementations, the first precursor gas 147 and the second precursor gas 150 are provided to the same processing chamber 104 (e.g., a single processing chamber 104 of the deposition system 100). In some implementations, the first precursor gas 147 and the second precursor gas 150 are provided to the same processing chamber 104 for use in the same deposition process. In some implementations, the first precursor gas 147 and the second precursor gas 150 are provided to the same processing chamber 104 for use in different deposition processes. In some implementations, the first precursor gas 147 and the second precursor gas 150 are provided to the same processing chamber 104 for a deposition process in which the first precursor gas 147 and the second precursor gas 150 are used to form or deposit the same layer or structure (e.g., the same barrier layer, the same seed layer, the same semiconductor structure) on a semiconductor wafer. In some implementations, the first precursor gas 147 and the second precursor gas 150 are provided to the same processing chamber 104 for a deposition process in which the first precursor gas 147 and the second precursor gas 150 are used to form or deposit different layers or structures (e.g., different barrier layers, different seed layers, different semiconductor structures) on a semiconductor wafer. In some implementations, the first precursor gas 147 and the second precursor gas 150 are provided to different processing chambers 104 for different deposition processes.

In some implementations, the processing chamber 104 includes a mixer 154 coupled to the first gas line 148 and the second gas line 152. The mixer 154 includes a gas mixer or a gas blender device and possibly one or more supporting devices, such as one or more sensors. The mixer 154 may be included on the lid 106, in the lid 106, or at another location in the deposition system 100. The controller 122 transmits a mixer control signal 156 to cause the mixer 154 to form a mixed precursor gas 158 from the first precursor gas 147 and the second precursor gas 150. The mixer control signal 156 includes a voltage, a current, a resistance, a digital communication, or another type of control signal. The controller 122 transmits a valve control signal 160 to cause the mixed precursor gas 158 to be provided into the processing chamber 104 (e.g., into a single processing chamber of the deposition system 100) such that the mixed precursor gas 158 is deposited on a semiconductor wafer 162. The valve control signal 160 includes a voltage, a current, a resistance, a digital communication, or another type of control signal. The mixed precursor gas 158 may include a mixture of a ruthenium precursor gas and a tantalum nitride precursor gas, or a mixture of other precursor gasses. The mixed precursor gas 158 may be provided into the processing chamber 104 to form a barrier layer (e.g., for use in forming the same barrier layer) that includes ruthenium and tantalum nitride (Ru(TaN)) or another compound material. The semiconductor wafer 162 is supported in the processing chamber 104 by a substrate stage 164. The substrate stage 164 includes a pedestal, an electrostatic chuck (e-chuck), a mechanical chuck, a vacuum chuck, or another type of device that is capable of supporting a semiconductor wafer 162.

As indicated above, the first ampoule 110 may be heated to approximately the first ampoule target temperature, and the second ampoule 112 may be heated and/or cooled to approximately the second ampoule target temperature. In some implementations, the first ampoule target temperature to generate the first precursor gas in the first ampoule 110 from the first precursor is greater relative to the second ampoule target temperature to generate the second precursor gas in the second ampoule 112 from the second precursor. This may occur, for example, where the temperature at which the first precursor transitions to a vapor is greater relative to the temperature at which the second precursor transitions to a vapor. In some implementations, the first ampoule target temperature is substantially equal to the second ampoule target temperature. This may occur, for example, where the temperature at which the first precursor transitions to a vapor is substantially the same as the temperature at which the second precursor transitions to a vapor.

In operation, the first ampoule target temperature of the first ampoule 110 results in the generation of convection heat by the first ampoule 110. Because of the close proximity of the first ampoule 110 and the second ampoule 112 (e.g., a distance of separation in a range from approximately 5 mm to approximately 15 mm), the second ampoule temperature sensor 136 detects a portion of the convection heat generated by the first ampoule 110 in the second ampoule ambient temperature. As the second ampoule temperature sensor 136 is configured to measure or detect the second ampoule ambient temperature of the second ampoule 112 (which is used to control the second ampoule heating element 116 and/or the cooling element 132), the portion of the convection heat from the first ampoule 110 that reaches the second ampoule 112 may affect the operation of the second ampoule temperature sensor 136 by increasing the second ampoule ambient temperature that is measured or detected by the second ampoule temperature sensor 136. This may result in an inaccurate temperature measurement of an amount of heat generated by the second ampoule 112. Accordingly, the convection heat from the first ampoule 110 that is detected by the second ampoule temperature sensor 136 is also included in the second ampoule sensor data provided to the controller 122. The controller 122 adjusts the second ampoule control signal 130 based on a measurement of the second ampoule ambient temperature that was caused by convection heat from the first ampoule 110. Adjustments by the controller 122 based on this second ampoule sensor data cause temperature oscillations (e.g., temperature vibration) at the controller 122 and at the second ampoule 112. Temperature oscillations occur when the controller 122 receives a value of the second ampoule sensor data that is different than the second ampoule target temperature. In response, the controller 122 adjusts the second ampoule temperature setpoints to cause the second ampoule ambient temperature to be corrected in a direction toward the second ampoule target temperature. This correction, when repeated, causes the second ampoule control signal 130 to oscillate in response to the convection heat from the first ampoule 110 that was transferred to the second ampoule 112.

Accordingly, the dual ampoule system 102 includes a separator plate 166 to increase the accuracy of the second ampoule ambient temperature measured or detected by the second ampoule temperature sensor 136 and to reduce and/or minimize temperature oscillations at the controller 122. The separator plate 166 is positioned between the first ampoule 110 and the second ampoule 112 to reduce the amount of the convection heat from the first ampoule 110 that arrives at the second ampoule 112 and is detected by the second ampoule temperature sensor 136. A reduction in the amount of the convection heat from the first ampoule 110 that arrives at the second ampoule 112 increases the stability of the second ampoule ambient temperature. The reduction in the transfer of the convection heat also increases the accuracy of the measurements performed by the second ampoule temperature sensor 136 and reduces temperature oscillations (e.g., temperature vibration) at the controller 122 and the second ampoule 112. This enables the controller 122 to more accurately and efficiently control the second ampoule heating element 116 and/or the cooling element 132 to heat and/or cool the second ampoule 112 to the second ampoule target temperature.

In some implementations, the separator plate 166 includes a planar heat shield 168 and an adjustment component 170. The planar heat shield 168 may be composed of a material with a thermal conductivity included in a range of approximately 0 Watts per meter-Kelvin (W/mK) to approximately 100 W/mK, as further described herein with respect to at least FIG. 6. The planar heat shield 168 is approximately planar and is positioned between the first ampoule 110 and the second ampoule 112. The planar heat shield 168 is configured to resist thermal transfer between the first ampoule 110 and the second ampoule 112, which reduces and/or minimizes the transfer of heat between the first ampoule 110 and the second ampoule 112 through the planar heat shield 168. The adjustment component 170 may be a mechanical, electrical, or pneumatic component that maintains the planar heat shield 168 in a selected position, as further described herein with respect to at least FIGS. 5A and 5B. The adjustment component 170 is coupled to an end of the planar heat shield 168 and permits the planar heat shield 168 to be selectively positioned closer to the first ampoule 110 or the second ampoule 112 to selectively adjust an amount of the convection heat that is transferred between the first ampoule 110 and the second ampoule 112.

In some implementations, the separator plate 166 partitions the airflow in the dual ampoule assembly 108 into a first airflow 172 around the first ampoule 110, and a second airflow 174 around the second ampoule 112. As further described herein, the first airflow 172 and the second airflow 174 then exit the dual ampoule assembly 108 based upon the airflow generated by the fan 140 and the position of the separator plate 166 with respect to the first ampoule 110, the second ampoule 112, and the exhaust line 144. The adjustment component 170 further permits the planar heat shield 168 to be selectively positioned closer to the first ampoule 110 or the second ampoule 112 to selectively adjust an amount of (or a rate of) the first airflow 172 that is removed through the exhaust line 144 and to selectively adjust an amount of (or a rate of) the second airflow 174 that is removed through the exhaust line 144. In some implementations, positioning the separator plate 166 may be performed by a mechanical operation or by an electrical/actuator operation, as further described herein with reference to at least FIGS. 5A and 5B. In some implementations, positioning the separator plate 166 may be manually fixed or may be adjusted by automation prior to or during a deposition process, as further described herein with reference to at least FIGS. 5A and 5B.

As indicated above, FIGS. 1A and 1B are provided as examples. Other examples may differ from what is described with regard to FIGS. 1A and 1B. For example, the first ampoule 110 and the second ampoule 112 may be adjacently located in a vertical orientation rather than a horizontal orientation. In some examples, the first hot can 118 and the second hot can 120 may be spatially located in a horizontal arrangement with respect to the first ampoule 110 and the second ampoule 112 rather than being spatially located in a vertical arrangement.

Figure 2A:
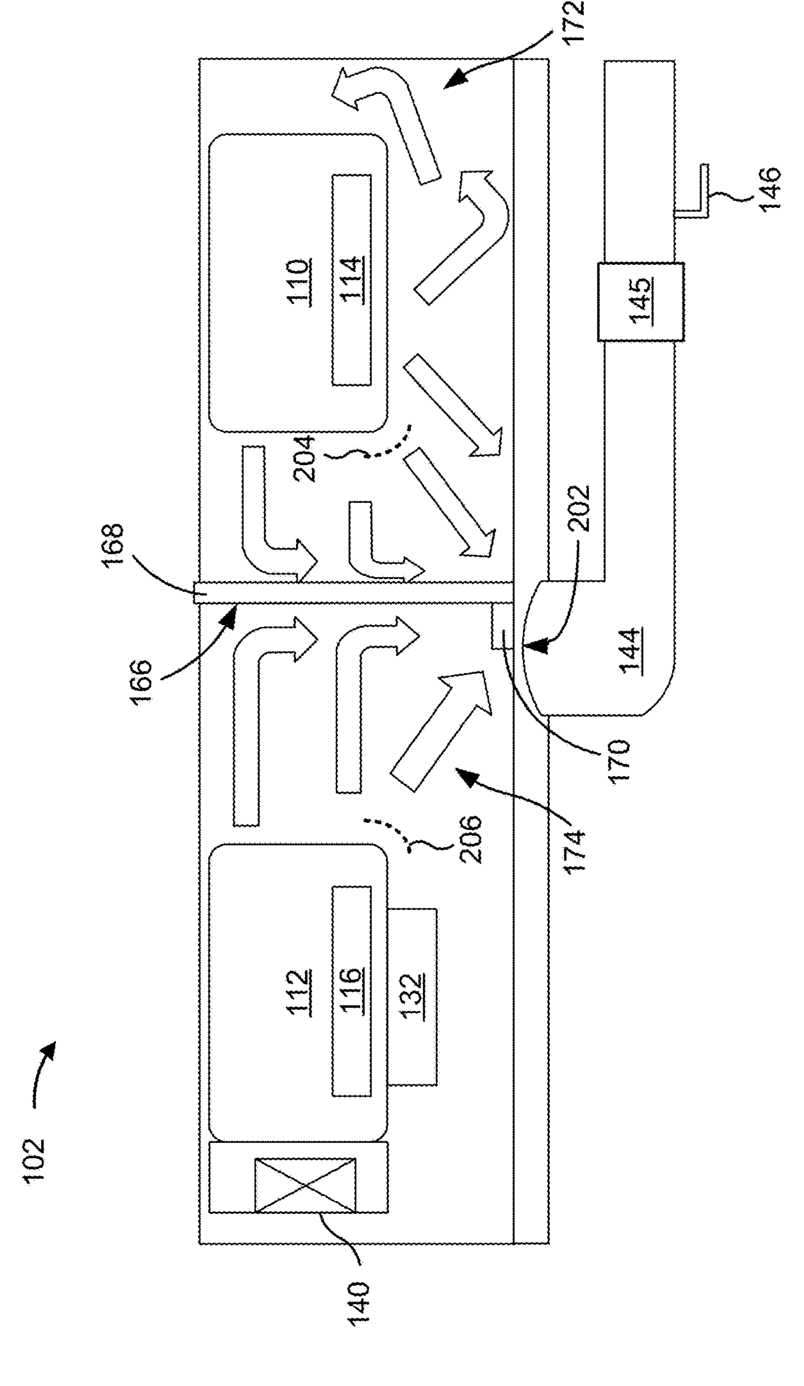
FIG. 2A is a diagram of an example configuration described herein for use in the example deposition system of FIGS. 1A and 1B.
Figure 2B:
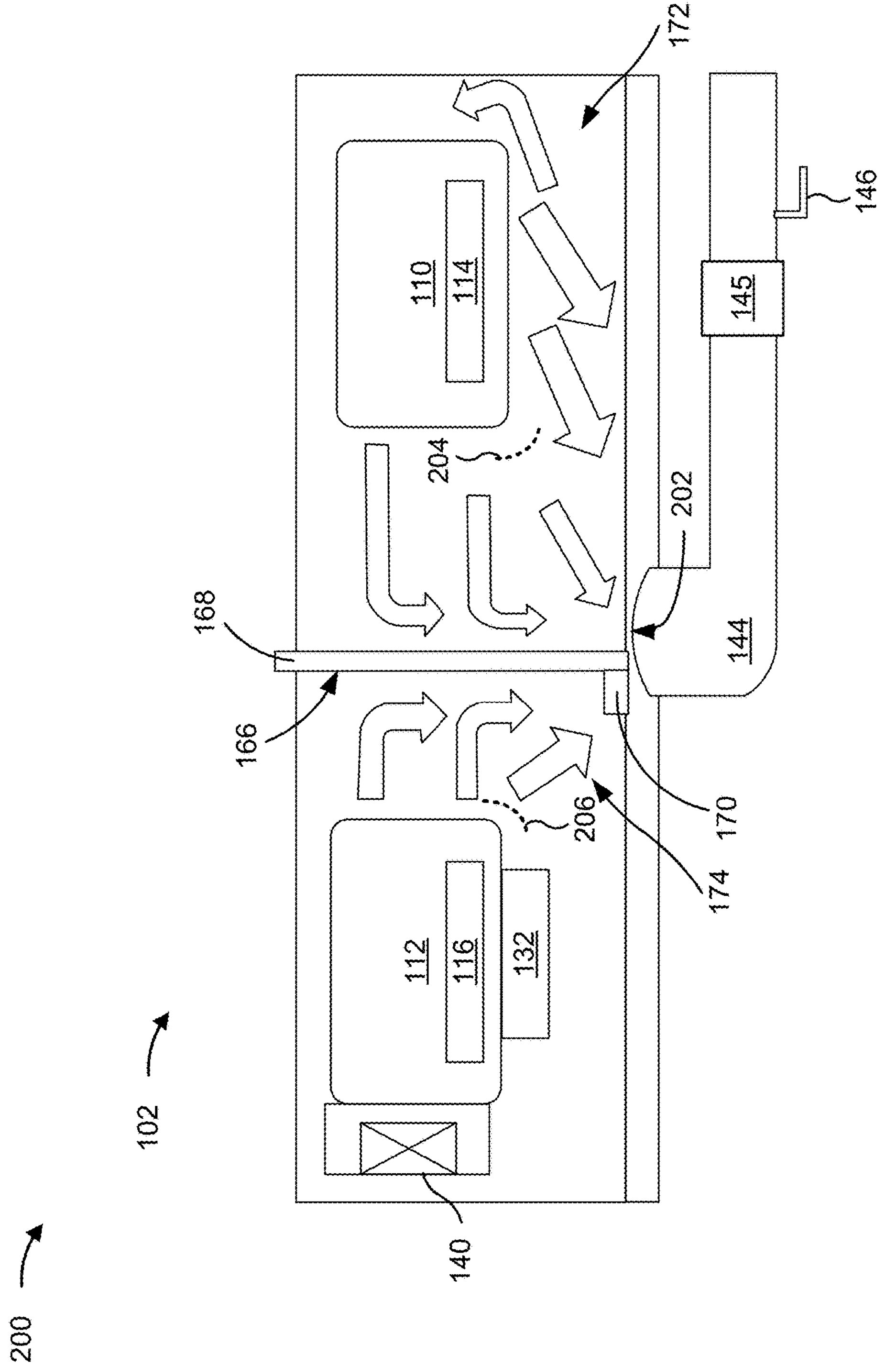
FIG. 2B is a diagram of an example configuration described herein for use in the example deposition system of FIGS. 1A and 1B.

FIGS. 2A and 2B are diagrams of example implementations 200 of configurations of the dual ampoule system 102. FIGS. 2A and 2B illustrate different placements of the separator plate 166 between the first ampoule 110 and the second ampoule 112. As described herein, the placement of the separator plate 166 between the first ampoule 110 and the second ampoule 112 may influence the first airflow 172 and the second airflow 174, which may affect the transfer of convection heat between the first ampoule 110 and the second ampoule 112.

FIG. 2A is a diagram of an example configuration described herein for use in the example deposition system 100 of FIGS. 1A and 1B. In FIG. 2A, the separator plate 166 is positioned closer (nearer) to the first ampoule 110 relative to the second ampoule 112. In some implementations, the separator plate 166 is positioned above and/or over an opening 202 of the exhaust line 144. In some implementations, the separator plate 166 is positioned closer to (or over) an edge of the opening 202 that is adjacent to the first ampoule 110 relative to an opposing edge of the opening 202 that is adjacent to the second ampoule 112.

In some implementations, the first ampoule heating element 114 in the first ampoule 110 generates a first convection heat 204 based on the first ampoule target temperature. The second ampoule heating element 116 in the second ampoule 112 generates a second convection heat 206 based on the second ampoule target temperature. The first convection heat 204 and the second convection heat 206 radiate in various directions, including toward an adjacent ampoule. When the first ampoule target temperature at the first ampoule 110 is greater (hotter) relative to the second ampoule target temperature at the second ampoule 112, the second ampoule 112 with the lesser target temperature (e.g., the second ampoule target temperature) may be less affected by the first convection heat 204 from the first ampoule 110.

In the dual ampoule system 102 of FIG. 2A, the separator plate 166 is positioned closer to the first ampoule 110, and farther from the second ampoule 112. The planar heat shield 168 of the separator plate 166 may be positioned closer to the first ampoule 110 by adjusting the position of the planar heat shield 168 using the adjustment component 170. In some implementations, positioning the separator plate 166 may be performed by mechanical operation or by an electrical/actuator operation, as further described herein. In some implementations, the positioning may be fixed for a duration of a deposition process. In some implementations, the positioning may be adjusted during a deposition process. Positioning the separator plate 166 closer to the first ampoule 110 allows more of the second airflow 174 and less of the first airflow 172 to exit the dual ampoule system 102 through the exhaust line 144. Further, positioning the separator plate 166 closer to the first ampoule 110 reduces the amount of the first convection heat 204 that reaches the second ampoule 112. As described, a reduction in the amount of the first convection heat 204 that reaches the second ampoule 112 results in a decrease in temperature oscillations (e.g., temperature vibration) at the controller 122 and the second ampoule 112.

FIG. 2B is a diagram of another example configuration described herein for use in the example deposition system 100 of FIGS. 1A and 1B. In FIG. 2B, the separator plate 166 is positioned closer (nearer) to the second ampoule 112 relative to the first ampoule 110. In some implementations, the separator plate 166 is positioned above and/or over the opening 202 of the exhaust line 144. In some implementations, the separator plate 166 is positioned closer to (or over) an edge of the opening 202 that is adjacent to the second ampoule 112 relative to an opposing edge of the opening 202 that is adjacent to the first ampoule 110.

In some implementations, the first ampoule 110 generates a first convection heat 204 based on the first ampoule target temperature. The second ampoule 112 generates a second convection heat 206 based on the second ampoule target temperature. The first convection heat 204 and the second convection heat 206 radiate in various directions, including toward an adjacent ampoule. As described, when first ampoule target temperature at the first ampoule 110 is greater (hotter) relative to the second ampoule target temperature at the second ampoule 112, the second ampoule 112 with the lesser target temperature (e.g., the second ampoule target temperature) may be more affected by the first convection heat 204 from the first ampoule 110.

In the dual ampoule system 102 of FIG. 2B, the separator plate 166 is positioned farther from the first ampoule 110, and closer to the second ampoule 112. Positioning the separator plate 166 farther from the first ampoule 110 allows more of the first airflow 172 and less of the second airflow 174 to exit the dual ampoule system 102 through the exhaust line 144. Further, positioning the separator plate 166 farther from the first ampoule 110 reduces the amount of the first convection heat 204 that reaches the second ampoule 112 relative to no having a separator plate 166 positioned between the first ampoule 110 and the second ampoule 112. As described, a reduction in the amount of the first convection heat 204 that reaches the second ampoule 112 results in a decrease in temperature oscillations (e.g., temperature vibration) at the controller 122 and the second ampoule 112.

As indicated above, FIGS. 2A and 2B are provided as examples. Other examples may differ from what is described with regard to FIGS. 2A and 2B. For example, in some implementations, the separator plate 166 may be positioned at an angle with respect to the first ampoule 110 and the second ampoule 112. In other examples, the separator plate 166 may be porous or contain louvers to allow the first airflow 172 and the second airflow 174 to mix. In some examples, the separator plate 166 may be positioned spatially between the first ampoule 110 and the second ampoule 112 based upon a difference between the first ampoule target temperature and the second ampoule target temperature.

Figure 3:
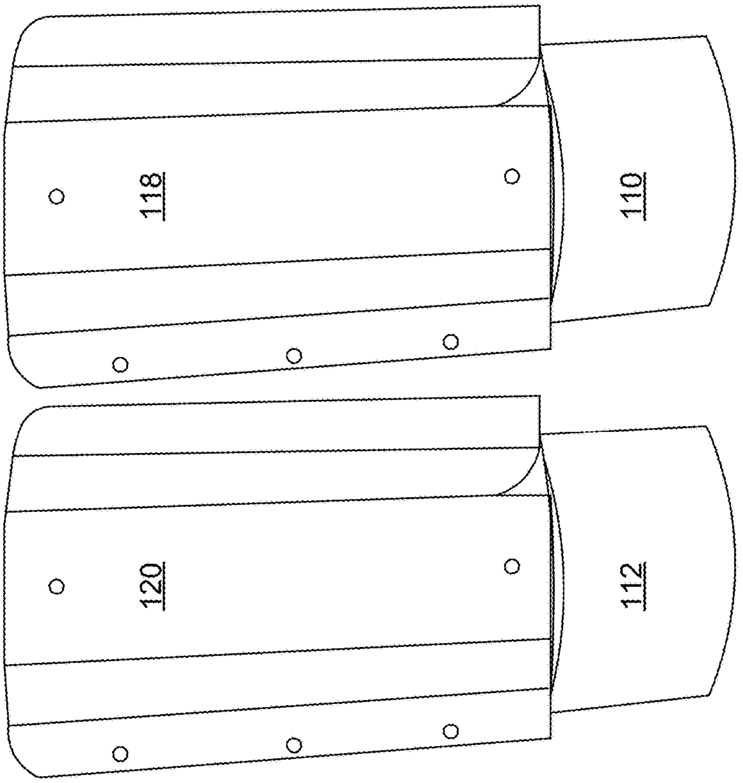
FIG. 3 is a diagram of a portion of the deposition system of FIGS. 1A and 1B.

FIG. 3 is a diagram of a portion of the deposition system 100 of FIGS. 1A and 1B. A dual ampoule assembly 108 includes the first ampoule 110 and the second ampoule 112. In some implementations, the dual ampoule assembly 108 includes the first hot can 118 located above and associated with the first ampoule 110. The dual ampoule assembly 108 further includes a second hot can 120 located above and associated with the second ampoule 112. The first hot can 118 and the second hot can 120 respectively surround portions of a gas inlet and a gas outlet for the first ampoule 110 and the second ampoule 112. The first hot can 118 and the second hot can 120 may be heated to provide a uniform temperature gradient along gas pathways including valves and gas lines associated with gas inlets and outlets in the deposition system 100. Maintaining the uniform temperature gradient aids in reducing condensation of gasses (e.g., the first precursor gas 147 and the second precursor gas 150) used in the deposition process which could result in unpredictable deposition process outcomes on the semiconductor wafer 162.

In some implementations, the dual ampoule assembly 108 places the first ampoule 110 and the second ampoule 112 adjacent and near each other. As described, the difference in the first ampoule target temperature relative to the second ampoule target temperature cause the first ampoule 110 and the second ampoule 112 to exhibit a temperature differential. The "hotter" ampoule (e.g., the first ampoule 110) generates convection heat (e.g., the first convection heat 204) that impacts the "cooler" ampoule (e.g., the second ampoule 112).

As indicated above, FIG. 3 is provided as an example. Other examples may differ from what is described with regard to FIG. 3. For example, the first hot can 118 and the second hot can 120 may be differently spaced or respectively differently located from the first ampoule 110 and the second ampoule 112 based upon the location of the gas pathways in the dual ampoule system 102.

Figure 4:
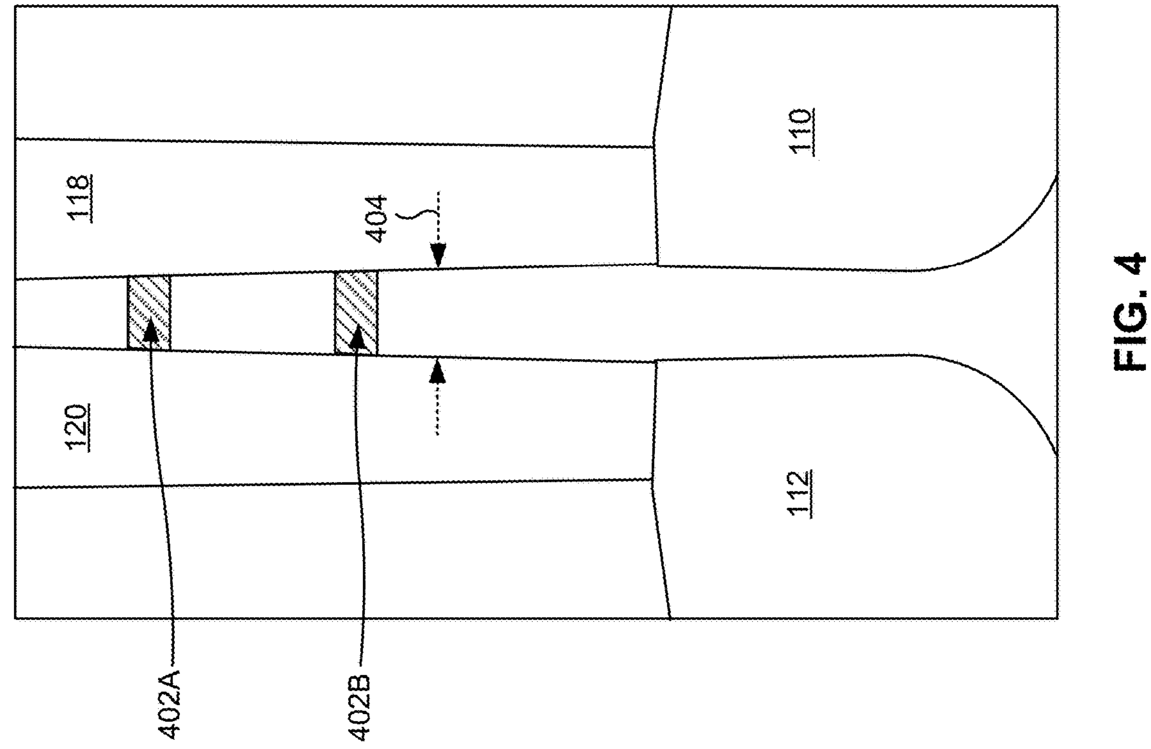
FIG. 4 is a diagram of a portion of the deposition system of FIGS. 1A and 1B.

FIG. 4 is a diagram of a portion of the deposition system 100 of FIGS. 1A and 1B. A dual ampoule assembly 108 includes the first ampoule 110, the second ampoule 112, the first hot can 118, and the second hot can 120. As described, the first ampoule 110 and the second ampoule 112 are positioned adjacent and near each other. In some implementations, the first ampoule 110 and the second ampoule 112 may be separated by a distance included in a range of approximately 5 mm to approximately 15 mm. However, other values for the distance are also within the scope of the present disclosure.

Further, the first hot can 118 and the second hot can 120 are positioned adjacent and near each other. In some implementations, the first hot can 118 and the second hot can 120 may be separated by a distance included in a range of approximately 5 mm to approximately 15 mm. However, other values for the distance are also within the scope of the present disclosure. The distance between the first ampoule 110 and the second ampoule 112 and/or the distance between the first hot can 118 and the second hot can 120 provides a thickness dimension for a portion of the separator plate (e.g., the separator plate 166).

In some implementations, the dual ampoule assembly 108 includes one or more gas lines 402A and/or 402B passing between, for example, the first hot can 118 and the second hot can 120. The one or more gas lines 402A and/or 402B provide a vertical height dimension for a portion of the separator plate (e.g., the separator plate 166). The first hot can 118 and the second hot can 120 may be separated or spaced apart by a distance 404. An example distance may be approximately 10 mm. However, other values for the distance 404 are within the scope of the present disclosure.

As indicated above, FIG. 4 is provided as an example. Other examples may differ from what is described with regard to FIG. 4. For example, the gas lines may be differently routed between adjacent hot cans (e.g., the first hot can 118 and the second hot can 120) in the dual ampoule system 102 resulting in different dimensions for the separator plate 166.

Figure 5A:
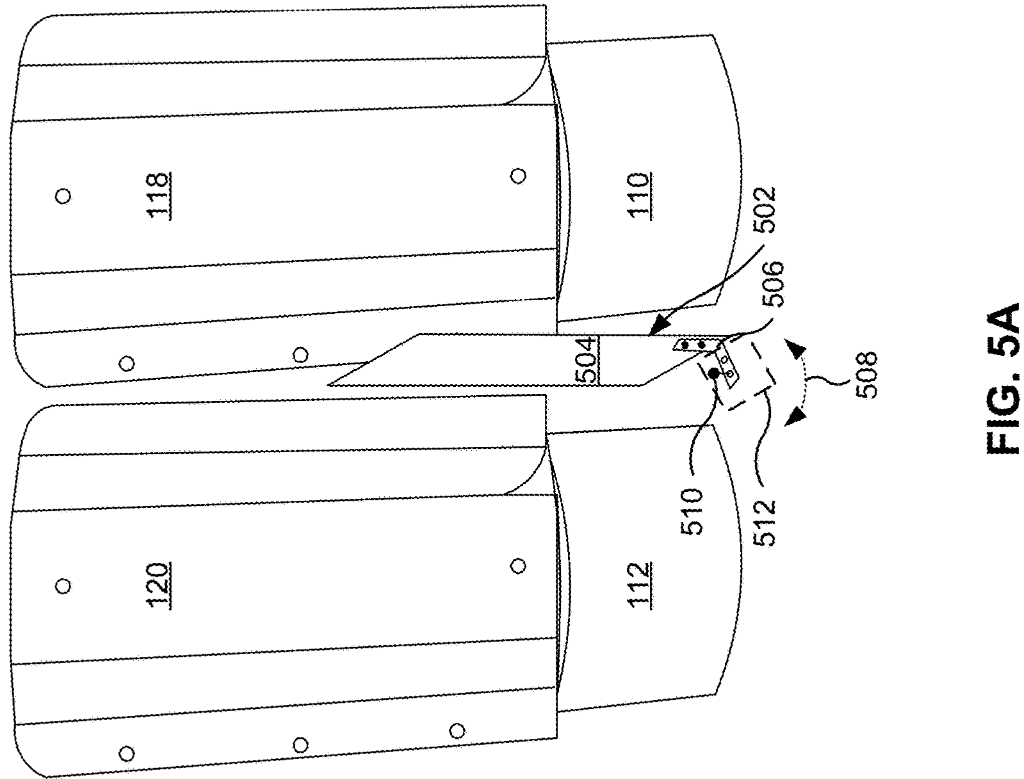
FIG. 5A is a diagram of an example implementation of a portion of the example deposition system of FIGS. 1A and 1B.
Figure 5B:
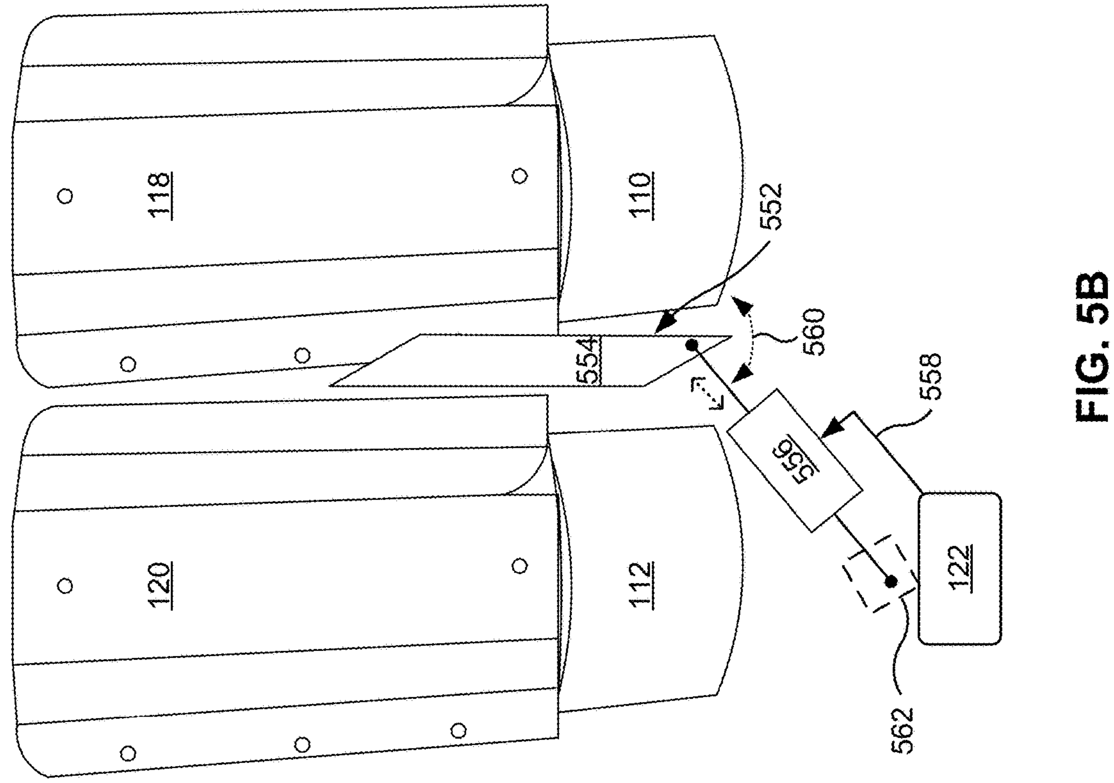
FIG. 5B is a diagram of an example implementation of a portion of the example deposition system of FIGS. 1A and 1B.

FIGS. 5A and 5B are diagrams of example implementations of a portion of the example deposition system 100 of FIGS. 1A and 1B. The diagrams illustrate alternative positioning and/or adjustment components 170 for the separator plate 166.

FIG. 5A is a diagram of an example implementation of a portion of the example deposition system 100 of FIGS. 1A and 1B. A dual ampoule assembly 500 (e.g., the dual ampoule assembly 108) includes the first ampoule 110, the second ampoule 112, the first hot can 118, and the second hot can 120. In some implementations, the dual ampoule assembly 500 includes a separator plate 502 (e.g., the separator plate 166). The separator plate 502 includes a planar heat shield 504 (e.g., the planar heat shield 168) and an adjustable bracket 506 (e.g., the adjustment component 170). The planar heat shield 504 may be composed of a material with a thermal conductivity included in a range of approximately 0 W/mK to approximately 100 W/mK, as further described herein with respect to at least FIG. 6.

The planar heat shield 504 is positioned between the first ampoule 110 and the second ampoule 112. The planar heat shield 504 is configured to resist thermal transfer between the first ampoule 110 and the second ampoule 112. In some implementations, the separator plate 502 extends partially, in a vertical direction, between the first hot can 118 and the second hot can 120. The separator plate 502 is positioned between the first ampoule 110 and the second ampoule 112 to reduce an amount of the convection heat (e.g., the first convection heat 204) from the first ampoule 110 that arrives at the second ampoule 112 as sensed by the second ampoule temperature sensor 136. As described, reduction in the amount of the convection heat (e.g., the first convection heat 204) from the first ampoule 110 that arrives at the second ampoule 112, reduces the temperature oscillations (e.g., temperature vibration) at the controller 122 and the second ampoule 112.

In some implementations, the adjustable bracket 506 couples to an end of the planar heat shield 504 and allows the planar heat shield 504 to be selectively positioned closer to the first ampoule 110 or the second ampoule 112. Positioning the planar heat shield 504 closer to the first ampoule 110 or the second ampoule 112 adjusts an amount of the convection heat (e.g., the first convection heat 204) that is transferred between the first ampoule 110 and the second ampoule 112.

In some implementations, the adjustable bracket 506 provides an adjustment of a position of an end of the separator plate 502 over the opening 202 of the exhaust line 144. Adjusting the position of the end of the separator plate 502 over the opening 202 of the exhaust line 144 adjustably directs an amount of the first airflow 172 from around the first ampoule 110 toward the exhaust line 144, and adjustably directs an amount of the second airflow 174 from around the second ampoule 112 toward the exhaust line 144.

In some implementations, the adjustable bracket 506 couples to the planar heat shield 504 at an end, and extends outward from between the first ampoule 110 and the second ampoule 112 to provide access to the adjustable bracket 506. The adjustable bracket 506 may be coupled to the planar heat shield 504 by one or more coupling techniques including fasteners, welding, adhesives, or other mechanical techniques. In some implementations, the adjustable bracket 506 is maintained at a setting along a range 508 by a fastener 510 that attaches to a base 512. The setting may include a range between opposing ends of the opening 202 of the exhaust line 144, as illustrated with respect to at least FIGS. 2A and 2B. In some implementations, the fastener 510 may be a screw, a bolt, a nail, or another mechanical fastener. In some implementations, the base 512 may be a deck or a shelf for supporting the first ampoule 110 and the second ampoule 112.

FIG. 5B is a diagram of another example implementation of a portion of the example deposition system 100 of FIGS. 1A and 1B. A dual ampoule assembly 550 (e.g., the dual ampoule assembly 108) includes the first ampoule 110, the second ampoule 112, the first hot can 118, and the second hot can 120. In some implementations, the dual ampoule assembly 550 includes a separator plate 552 (e.g., the separator plate 166). The separator plate 552 is positioned between the first ampoule 110 and the second ampoule 112 to reduce the amount of the convection heat (e.g., the first convection heat 204) from the first ampoule 110 that arrives at the second ampoule 112 as sensed by the second ampoule temperature sensor 136. A reduction in an amount of the convection heat (e.g., the first convection heat 204) from the first ampoule 110 that arrives at the second ampoule 112, reduces the temperature oscillations (e.g., temperature vibration) at the controller 122 and the second ampoule 112.

In some implementations, the separator plate 552 includes a planar heat shield 554 (e.g., the planar heat shield 168) and an actuator 556 (e.g., the adjustment component 170). The planar heat shield 554 is positioned between the first ampoule 110 and the second ampoule 112. The planar heat shield 554 is configured to resist thermal transfer between the first ampoule 110 and the second ampoule 112. In some implementations, the separator plate 552 extends partially, in a vertical direction, between the first hot can 118 and the second hot can 120.

In some implementations, the actuator 556 couples to an end of the planar heat shield 554 and allows the planar heat shield 554 to be selectively positioned closer to the first ampoule 110 or the second ampoule 112. The actuator 556 may be coupled to the end of the planar heat shield 554 by one or more coupling techniques including fasteners, welding, adhesives, or other mechanical techniques. Positioning the planar heat shield 554 closer to the first ampoule 110 or the second ampoule 112 adjusts an amount of convection heat (e.g., the first convection heat 204) that is transferred between the first ampoule 110 and the second ampoule 112.

In some implementations, the controller 122 transmits an actuator control signal 558 to cause the actuator 556 to move the separator plate 552 to a position across a range 560. The setting may include a range between opposing ends of the opening 202 of the exhaust line 144, as illustrated with respect to at least FIGS. 2A and 2B. In some implementations, the actuator 556 is configured to cause the planar heat shield 554 to be selectively positioned closer to the first ampoule 110 or the second ampoule 112. Placement of the planar heat shield 554 closer to the first ampoule 110 or the second ampoule 112 adjusts an amount of the convection heat (e.g., the first convection heat 204) that is transferred between the first ampoule 110 and the second ampoule 112. In some implementations, the actuator 556 provides an adjustment of a position of an end of the separator plate 502 over the opening 202 of the exhaust line 144. Adjusting the position of the end of the separator plate 552 over the opening 202 of the exhaust line 144 adjustably directs an amount of the first airflow 172 from around the first ampoule 110 toward the exhaust line 144, and adjustably directs an amount of the second airflow 174 from around the second ampoule 112 toward the exhaust line 144.

In some implementations, the actuator 556 couples between the planar heat shield 554 and a base 562. In some implementations, the base 562 may be a deck or a shelf for supporting the first ampoule 110 and the second ampoule 112.

As indicated above, FIGS. 5A and 5B are provided as examples. Other examples may differ from what is described with regard to FIGS. 5A and 5B. For example, in some implementations, the planar heat shield (e.g., the planar heat shield 168, the planar heat shield 504, the planar heat shield 554) may be maintained in a position between the first ampoule 110 and the second ampoule 112 using a friction-based adjustment component. For example, the planar heat shield (e.g., the planar heat shield 168, the planar heat shield 504, the planar heat shield 554) may be free-standing between the first ampoule 110 and the second ampoule 112. In other examples, the actuator 556 may be an electrical, mechanical, electromechanical, or pneumatic actuator. In some implementations, the planar heat shield (e.g., the planar heat shield 168, the planar heat shield 504, the planar heat shield 554) may be flexible and allow an end of the planar heat shield (e.g., the planar heat shield 168, the planar heat shield 504, the planar heat shield 554) to flex toward one ampoule (e.g., the first ampoule 110 or the second ampoule 112) in a dual ampoule system 102.

Figure 6:
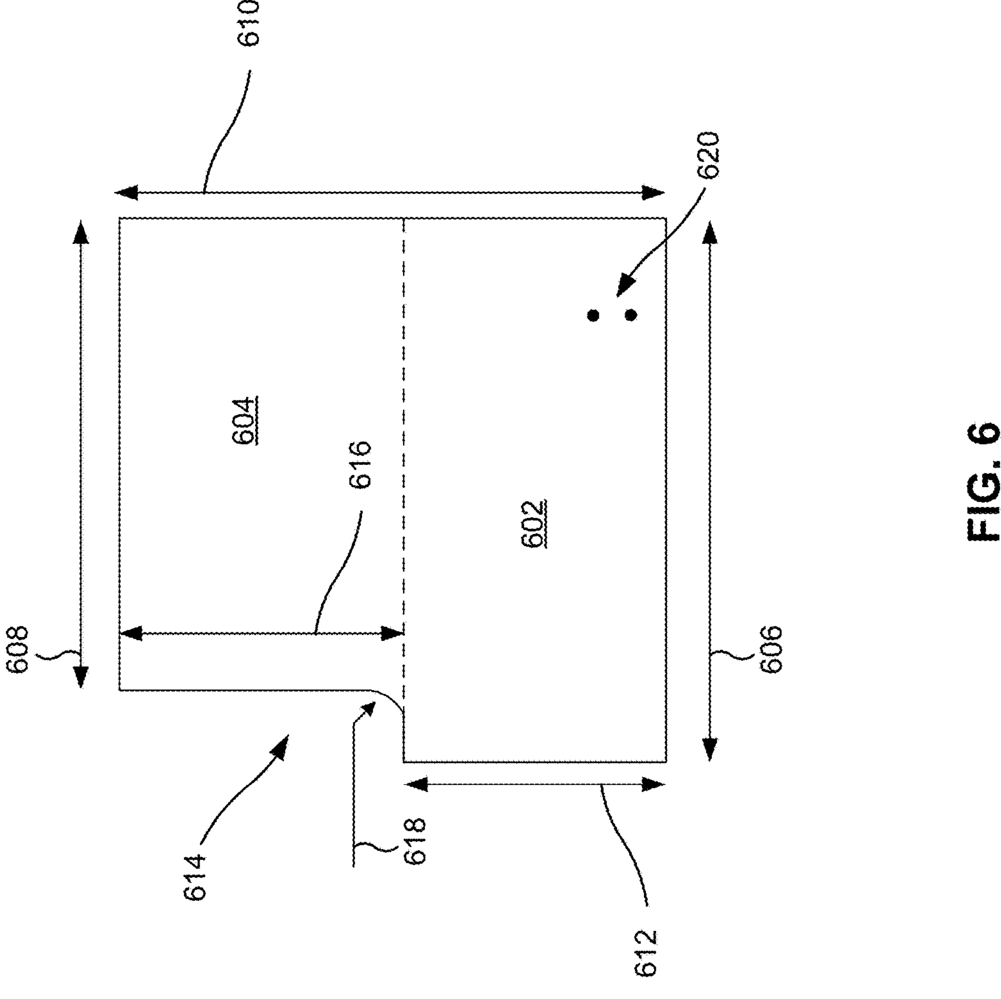
FIG. 6 is a diagram of an example planar heat shield for the example deposition system of FIGS. 1A and 1B.

FIG. 6 is a diagram of an example planar heat shield for the example deposition system 100 of FIGS. 1A and 1B. As described, the separator plate (e.g., the separator plate 166, 502, and 552) includes the planar heat shield (e.g., the planar heat shield 168, the planar heat shield 504, the planar heat shield 554). In some implementations, the planar heat shield 168 is positioned between the first ampoule 110 and the second ampoule 112, and is configured to resist thermal transfer between the first ampoule 110 and the second ampoule 112, as described above.

In some implementations, the planar heat shield 168 may be composed of a material with a thermal conductivity included in a range of approximately 0 W/mK to approximately 100 W/mK. However, other values for the thermal conductivity are also within the scope of the present disclosure. In some implementations, the planar heat shield 168 may be composed of a material such as stainless steel, ceramic, glass, or titanium. However, other materials are also within the scope of the present disclosure. In some implementations, the planar heat shield 168 may be composed of a material selected based upon material characteristics including a heat insulative characteristic, a material weight characteristic, and/or a material fragility characteristic.

In some implementations, the planar heat shield 168 includes a first region 602 and a second region 604. The first region 602 includes a dimension of a first width 606, and the second region 604 includes a dimension of a second width 608 on an opposing side of the planar heat shield 168. The second width 608 is lesser relative to the first width 606 to permit the planar heat shield 168 to be positioned around one or more gas lines (e.g., the gas lines 402A and/or 402B), as described with respect to FIG. 4. In some implementations, the first width 606 may be included in a range of approximately 230 mm to approximately 270 mm, and the second width 608 may be included in a range of approximately 195 mm to approximately 235 mm. However, other values for the widths are also within the scope of the present disclosure.

In some implementations, the planar heat shield 168 includes a dimension of a first height 610 and a dimension of a second height 612 on an opposing side of the planar heat shield 168. The second height 612 is lesser relative to the first height 610 to permit the planar heat shield 168 to be positioned around one or more gas lines (e.g., the gas lines 402A and/or 402B), as described with respect to FIG. 4. In some implementations, the first height 610 may be included in a range of approximately 230 mm to approximately 270 mm, and the second height 612 may be included in a range of approximately 105 mm to approximately 145 mm. However, other values for the heights are also within the scope of the present disclosure.

In some implementations, the planar heat shield 168 may include a thickness dimension included in a range of approximately 0.5 mm to approximately 2 mm. However, other values for the thickness are also within the scope of the present disclosure. The range of the thickness dimension may be bounded by a thickness sufficiently large to provide adequate heat insulation, and sufficiently small to fit between the first ampoule 110 and the second ampoule 112, and/or the first hot can 118 and the second hot can 120.

In some implementations, a reduction in the planar heat shield 168 from the first width 606 to the second width 608, and a reduction in the planar heat shield 168 from the first height 610 to the second height 612 create a cut-out 614 in the planar heat shield 168. The cut-out 614 may include a cut-out height 616 of a dimension of approximately a difference between the first height 610 and the second height 612. In some implementations, the cut-out 614 may include an angled profile 618 to be positioned around one or more gas lines (e.g., the gas lines 402A and/or 402B), as described with respect to FIG. 4.

In some implementations, the planar heat shield 168 includes one or more mounting profiles 620 (e.g., holes) to facilitate attachment of the adjustment component 170. In some implementations, the one or more mounting profiles 620 may facilitate an attachment of the adjustable bracket 506 of FIG. 5A. In some implementations, the one or more mounting profiles 620 may facilitate an attachment of the actuator 556 of FIG. 5B.

As indicated above, FIG. 6 is provided as an example. Other examples may differ from what is described with regard to FIG. 6. For example, the planar heat shield 168 may include other cut-outs or profiles to accommodate other spatial dimensions between the first ampoule 110 and the second ampoule 112 and/or between the first hot can 118 and the second hot can 120.

FIGS. 7A-7E are diagrams of an example process flow for use in the example implementation of the example deposition system 100 of FIGS. 1A and 1B. An example implementation 700, according to an example deposition process, is described where one or more operations of the example process flow may utilize the deposition system 100 described herein. The example implementation 700 may be an example of forming a dual damascene structure, although formation of other structures are also within the scope of the disclosure. In some implementations, the deposition system 100 performs one or more of the processes and/or operations described in connection with FIGS. 7A-7E.

Figure 7A:
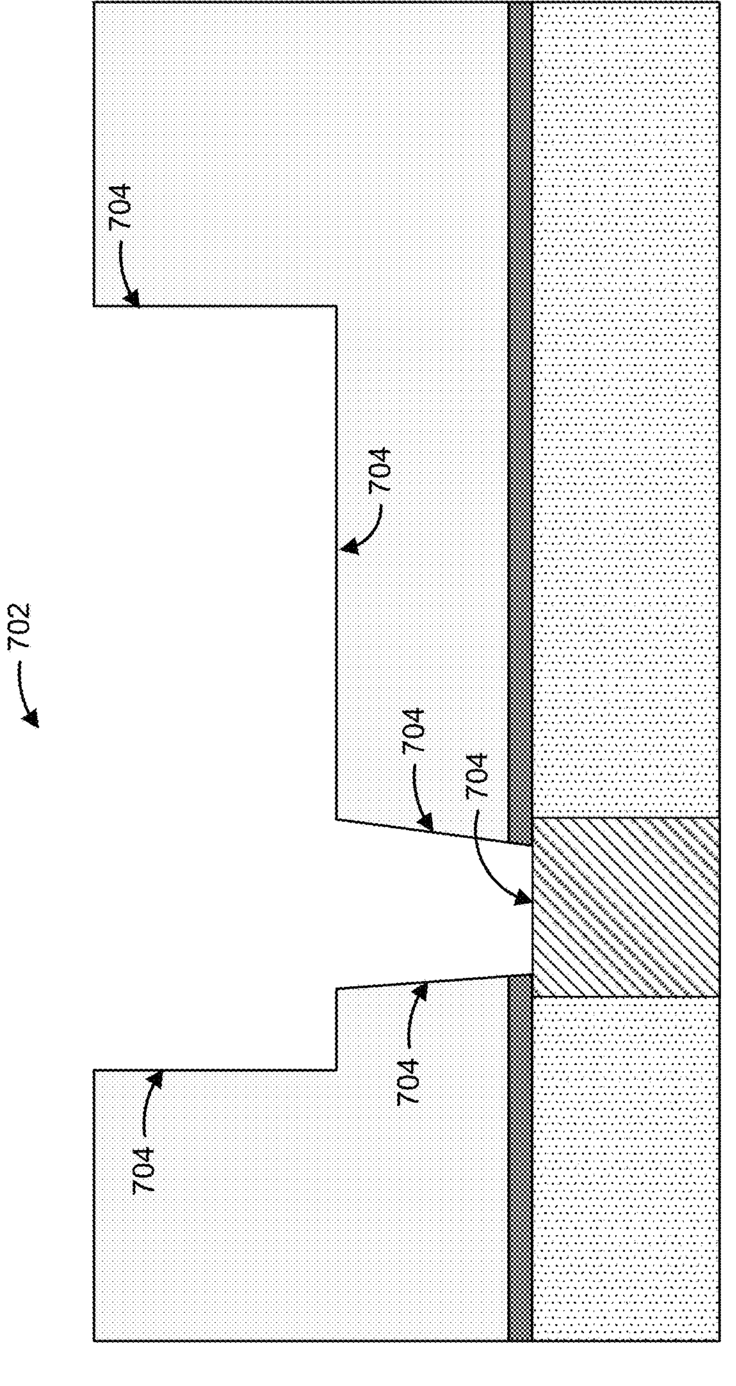
FIGS. 7A-7E are diagrams of an example process flow for use in the example implementation of the example processing system of FIGS. 1A and 1B.

Turning to FIG. 7A, the dual damascene structure may be formed in a recess 702. The recess 702 may be formed using various semiconductor processing techniques, including photoresist formation techniques, developer techniques, exposure techniques, and/or etching techniques, among other examples. The recess 702 may be formed in a dielectric layer (e.g., an interlayer dielectric (ILD) layer or another type of dielectric layer) over and to a conductive structure. The conductive structure may include a metal gate, a source/drain contact, an interconnect structure, a via, a metal line, or another type of conductive structure included in a semiconductor device. The recess 702 includes a lower portion having one or more surfaces 704, and an upper portion having one or more surfaces 704. The lower portion includes a portion of the recess 702 in which a "via" portion of the dual damascene structure is to be formed. The upper portion includes a portion of the recess 702 in which the "metal line" portion of the dual damascene is to be formed.

A pre-clean operation is performed to clean the one or more surfaces 704 in the recess 702 (e.g., after formation of the recess 702). The pre-clean operation may include positioning the semiconductor wafer 162 in a processing chamber 104. The processing chamber 104 may be pumped down to a partial vacuum, and the surfaces 704 are cleaned using a plasma-based and/or a chemical-based pre-clean agent. The pre-clean operation is performed to clean (e.g., remove) oxides and other contaminants or byproducts from the surfaces 704.

Figure 7B:
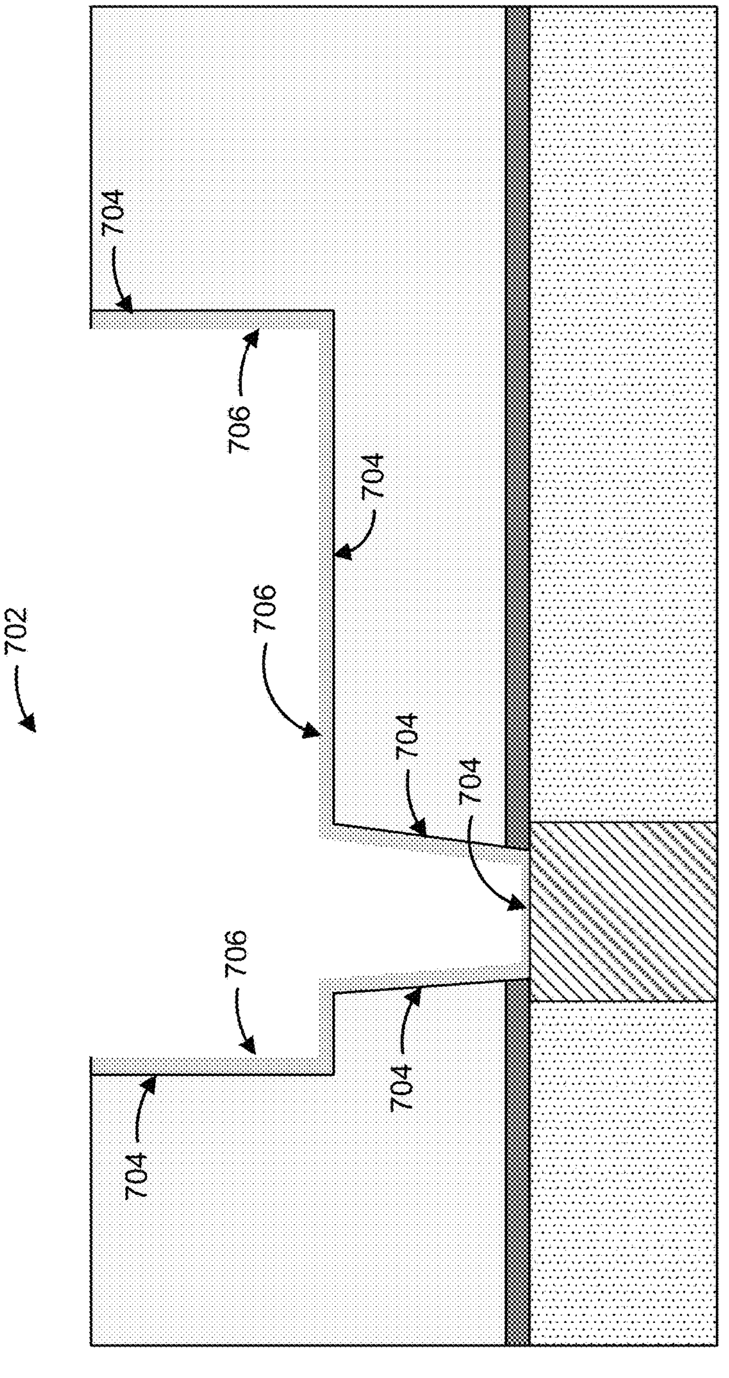

FIG. 7B is a diagram of an example deposition operation. In some implementations, the deposition operation is performed to form a barrier layer 706 on the surfaces 704. The barrier layer 706 is formed to promote adhesion between the dual damascene structure that is to be formed in the recess 702 and the surfaces 704, to prevent material migration between the dual damascene structure and the surfaces 704, and/or for another purpose.

The barrier layer 706 is formed from the mixed precursor gas 158 using a deposition process described herein with respect to the deposition system 100. The mixed precursor gas 158 may include a first precursor gas (e.g., the first precursor gas 147) comprised of a ruthenium (Ru) precursor gas, and a second precursor gas (e.g., the second precursor gas 150) comprised of a tantalum nitride (TaN) precursor gas. Accordingly, the barrier layer 706 may include a ruthenium and tantalum nitride (Ru(TaN)) layer.

In some implementations, the mixed precursor gas 158 is formed using the dual ampoule assembly 108 including the separator plate 166 positioned between the first ampoule 110 and the second ampoule 112 to prevent a portion of the convection heat (e.g., the first convection heat 204) from transferring from the first ampoule 110 to the second ampoule 112.

Figure 7C:
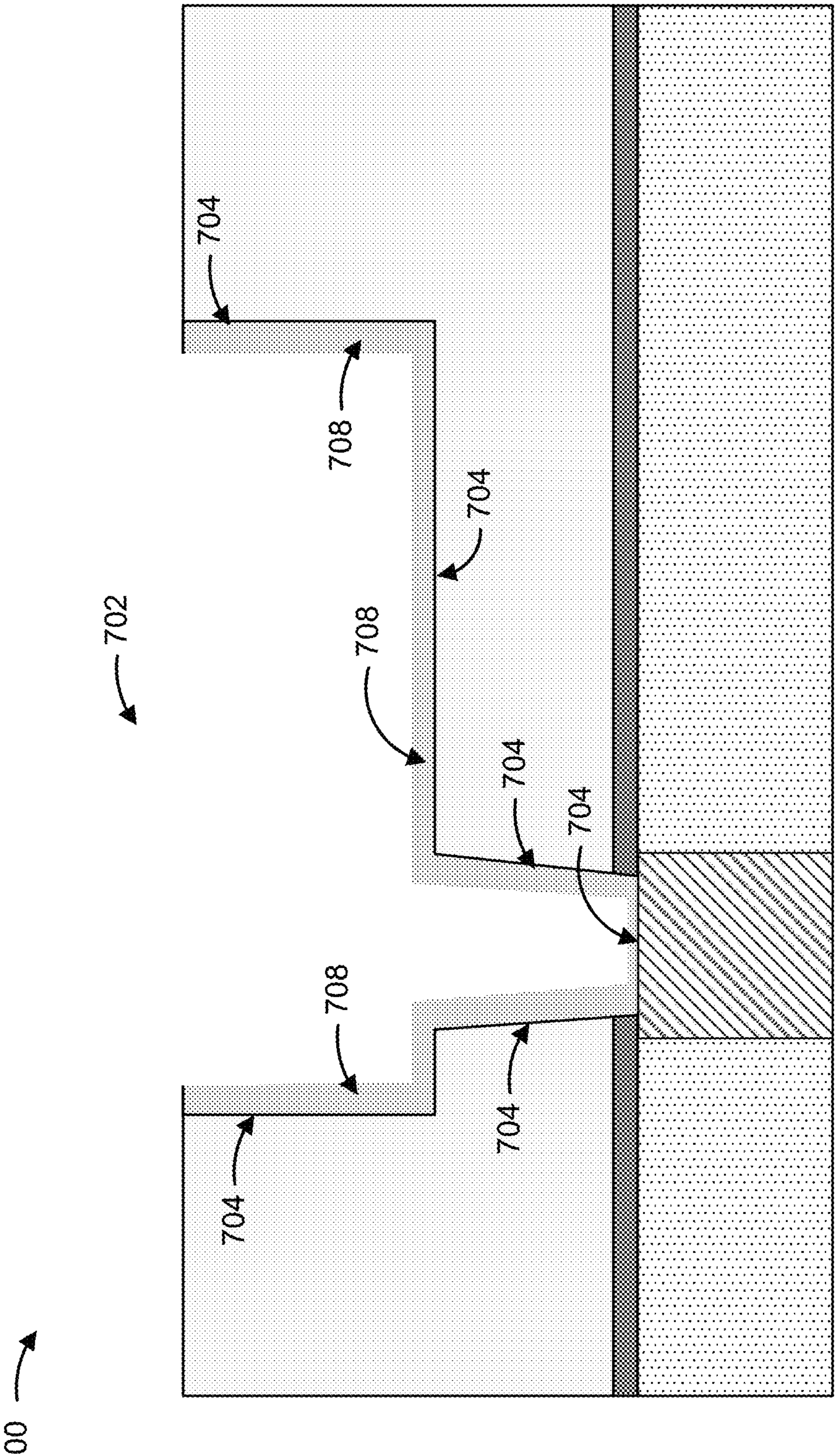

FIG. 7C is a diagram of an example deposition operation. In some implementations, the deposition operation is performed to form a barrier layer 708 on the barrier layer 706. The barrier layer 708 may include a tantalum nitride ($Ta_xN_y$) barrier layer, a titanium nitride ($Ti_xN_y$) barrier layer, or another type of barrier layer. The barrier layer 708 may be deposited using a CVD technique, a PVD technique, an ALD technique, and/or another deposition technique.

Figure 7D:
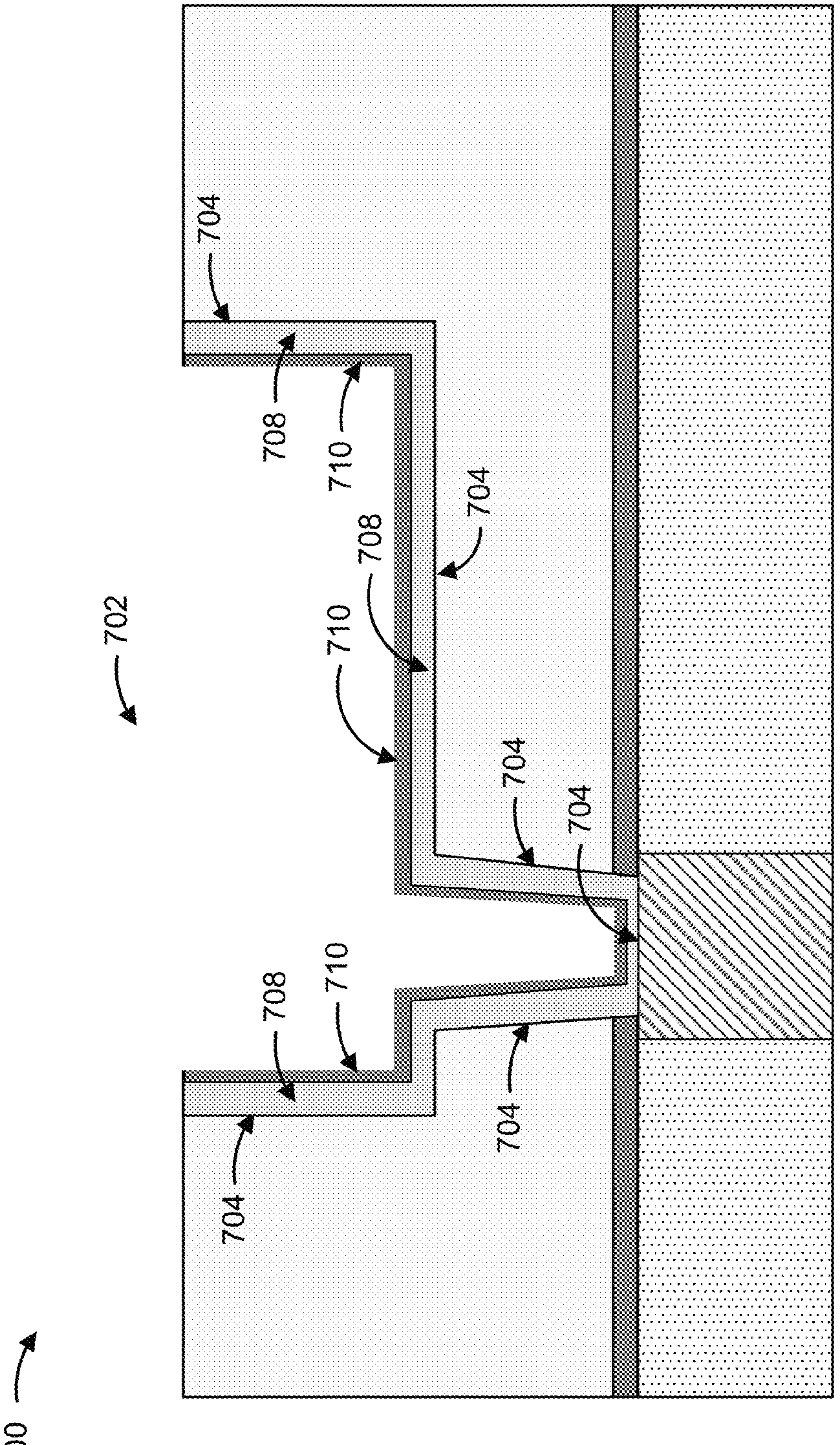

FIG. 7D is a diagram of an example deposition operation. In some implementations, the deposition operation is performed to form a liner 710 on the barrier layer 708. The liner 710 and the barrier layer 708 may be included to reduce, minimize, and/or prevent copper electromigration from BEOL layers that are to be formed on other areas of the semiconductor wafer 162 (which can cause material degradation and device performance reduction). The liner 710 includes cobalt (Co) or another type of metal liner. The liner 710 may be deposited using a CVD technique, a PVD technique, an ALD technique, and/or another deposition technique.

Figure 7E:
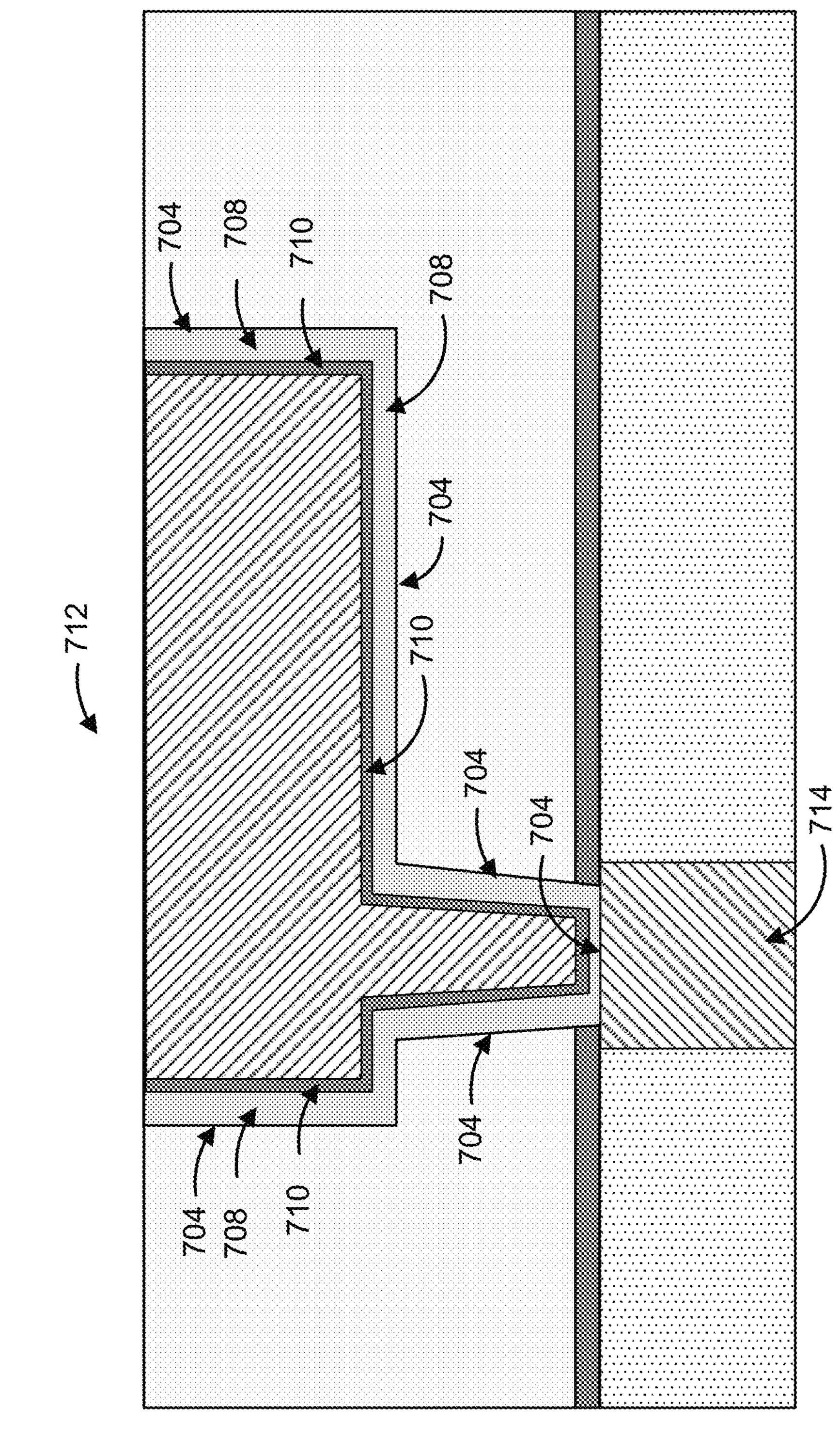

FIG. 7E is a diagram of an example deposition operation. In some implementations, the deposition operation is performed to fill the opening 702 with a conductive material such as copper (Cu) to form a dual damascene structure 712 in the opening 702 over the barrier layers 706 and 708, and over the liner 710. The dual damascene structure 712 may be formed using a CVD technique, a PVD technique, an ALD technique, an electroplating technique, and/or another deposition technique. In some implementations, the dual damascene structure 712 is formed by forming a copper seed layer (or another type of seed layer) on the liner 710, and then filling the remaining portion of the opening 702 over the seed layer to form the dual damascene structure 712.

As indicated above, FIGS. 7A-7E are provided as examples. Other examples may differ from what is described with regard to FIGS. 7A-7E. For example, structures other than the dual damascene structure 712 may be formed using the deposition system 100 described herein.

Figure 8:
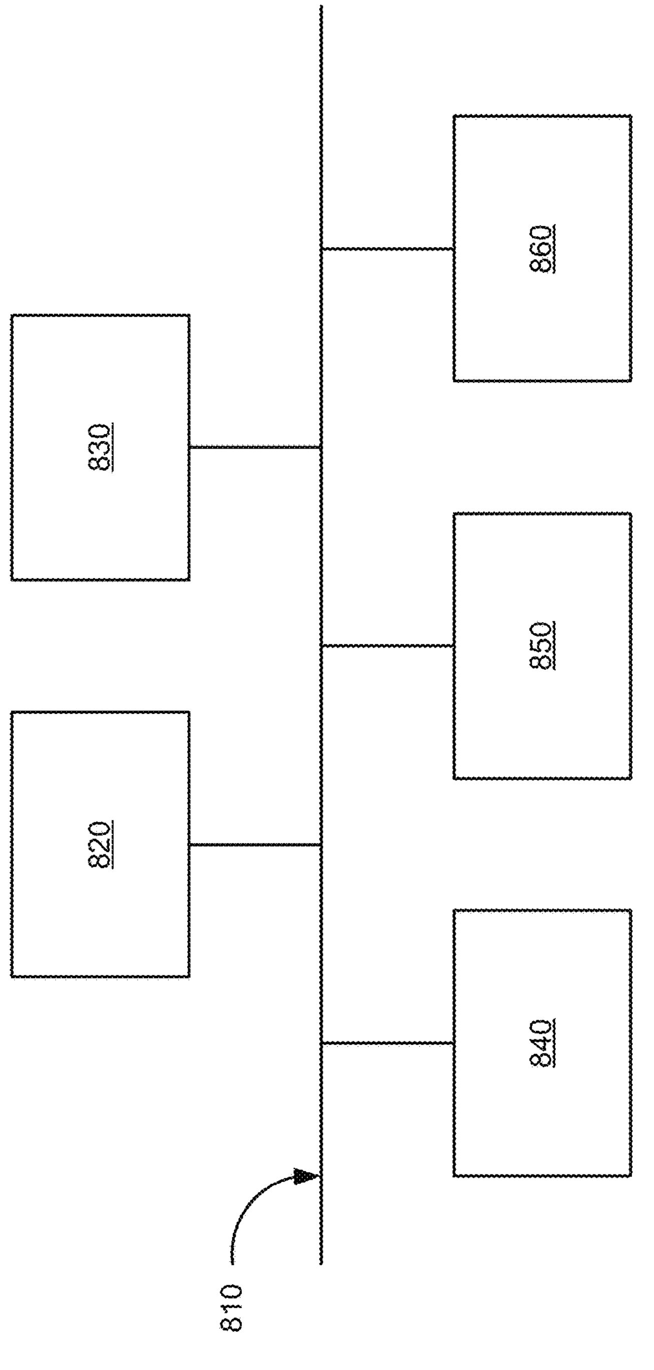
FIG. 8 is a diagram of example components of one or more devices of FIGS. 1A and 1B described herein.

FIG. 8 is a diagram of example components of a device 800, which may correspond to the deposition system 100 and/or the dual ampoule system 102. In some implementations, the deposition system 100 and/or the dual ampoule system 102 may include one or more devices 800 and/or one or more components of device 800. As shown in FIG. 8, device 800 may include a bus 810, a processor 820, a memory 830, an input component 840, an output component 850, and a communication component 860.

Bus 810 includes one or more components that enable wired and/or wireless communication among the components of device 800. Bus 810 may couple together two or more components of FIG. 8, such as via operative coupling, communicative coupling, electronic coupling, and/or electric coupling. Processor 820 includes a central processing unit, a graphics processing unit, a microprocessor, a controller, a microcontroller, a digital signal processor, a field-programmable gate array, an application-specific integrated circuit, and/or another type of processing component. Processor 820 is implemented in hardware, firmware, or a combination of hardware and software. In some implementations, processor 820 includes one or more processors capable of being programmed to perform one or more operations or processes described elsewhere herein.

Memory 830 includes volatile and/or nonvolatile memory. For example, memory 830 may include random access memory (RAM), read only memory (ROM), a hard disk drive, and/or another type of memory (e.g., a flash memory, a magnetic memory, and/or an optical memory). Memory 830 may include internal memory (e.g., RAM, ROM, or a hard disk drive) and/or removable memory (e.g., removable via a universal serial bus connection). Memory

830 may be a non-transitory computer-readable medium. Memory 830 stores information, instructions, and/or software (e.g., one or more software applications) related to the operation of device 800. In some implementations, memory 830 includes one or more memories that are coupled to one or more processors (e.g., processor 820), such as via bus 810.

Input component 840 enables device 800 to receive input, such as user input and/or sensed input. For example, input component 840 may include a touch screen, a keyboard, a keypad, a mouse, a button, a microphone, a switch, a sensor, a global positioning system sensor, an accelerometer, a gyroscope, and/or an actuator. Output component 850 enables device 800 to provide output, such as via a display, a speaker, and/or a light-emitting diode. Communication component 860 enables device 800 to communicate with other devices via a wired connection and/or a wireless connection. For example, communication component 860 may include a receiver, a transmitter, a transceiver, a modem, a network interface card, and/or an antenna.

Device 800 may perform one or more operations or processes described herein. For example, a non-transitory computer-readable medium (e.g., memory 830) may store a set of instructions (e.g., one or more instructions or code) for execution by processor 820. Processor 820 may execute the set of instructions to perform one or more operations or processes described herein. In some implementations, execution of the set of instructions, by one or more processors 820, causes the one or more processors 820 and/or the device 800 to perform one or more operations or processes described herein. In some implementations, hardwired circuitry may be used instead of or in combination with the instructions to perform one or more operations or processes described herein. Additionally, or alternatively, processor 820 may be configured to perform one or more operations or processes described herein. Thus, implementations described herein are not limited to any specific combination of hardware circuitry and software.

The number and arrangement of components shown in FIG. 8 are provided as an example. Device 800 may include additional components, fewer components, different components, or differently arranged components than those shown in FIG. 8. Additionally, or alternatively, a set of components (e.g., one or more components) of device 800 may perform one or more functions described as being performed by another set of components of device 800.

Figure 9:
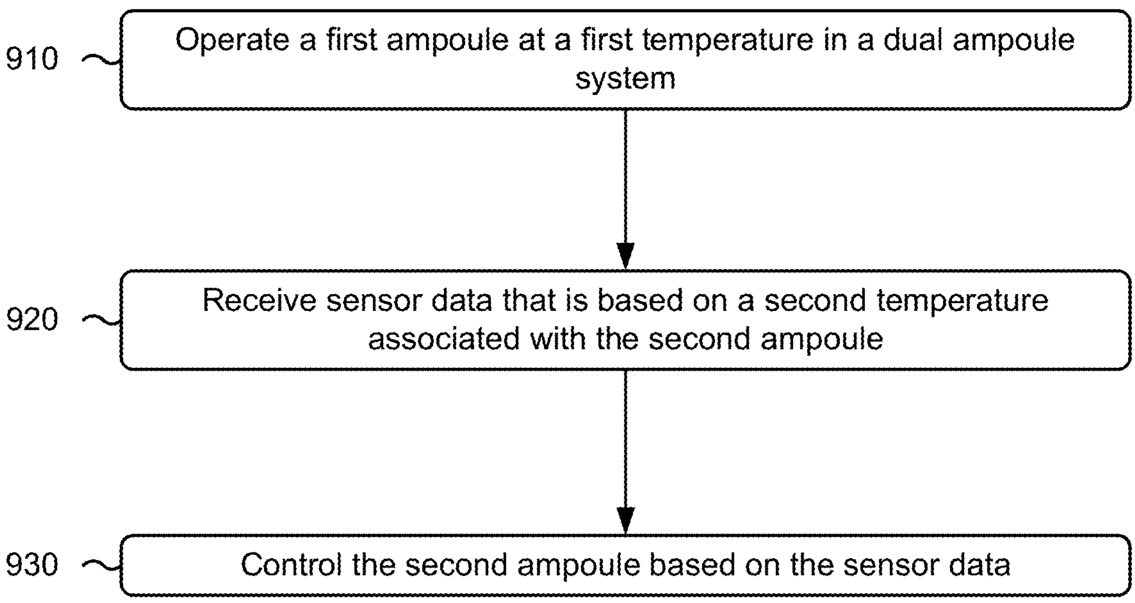
FIG. 9 is a flowchart of an example process using the example deposition system of FIGS. 1A and 1B described herein.

FIG. 9 is a flowchart of an example process 900 for using the example deposition system of FIGS. 1A and 1B described herein. The example process 900 is associated with a dual ampoule separator plate and method. In some implementations, one or more process blocks of FIG. 9 may be performed by a controller (e.g., controller 122). In some implementations, one or more process blocks of FIG. 9 may be performed by another device or a group of devices separate from or including the controller 122, such as the deposition system 100, the dual ampoule system 102, and/or the processing chamber 104. Additionally, or alternatively, one or more process blocks of FIG. 9 may be performed by one or more components of device 800, such as processor 820, memory 830, input component 840, output component 850, and/or communication component 860.

As shown in FIG. 9, process 900 may include operating a first ampoule at a first temperature in a dual ampoule system (block 910). For example, the controller 122 may operate a first ampoule 110 at a first temperature in a dual ampoule system 102. The dual ampoule system 102 includes: the first ampoule 110, a second ampoule 112 adjacent to the first ampoule 110, and a separator plate 166 between the first ampoule 110 and the second ampoule 112. The first ampoule 110 emits convection heat (e.g., the first convection heat 204) as a result of operating at the first temperature. The separator plate 166 prevents a portion of the convection heat (e.g., the first convection heat 204) from transferring from the first ampoule 110 to the second ampoule 112, as described above. In some implementations, the dual ampoule system 102 includes: the first ampoule 110, a second ampoule 112 adjacent to the first ampoule 110, and a separator plate 166 between the first ampoule 110 and the second ampoule 112. In some implementations, the first ampoule 110 emits convection heat (e.g., the first convection heat 204) as a result of operating at the first temperature. In some implementations, the separator plate 166 prevents a portion of the convection heat (e.g., the first convection heat 204) from transferring from the first ampoule 110 to the second ampoule 112.

As further shown in FIG. 9, process 900 may include receiving sensor data that is based on a second temperature associated with the second ampoule (block 920). For example, the controller 122 may receive sensor data that is based on a second temperature associated with the second ampoule 112, and second temperature is different from the first temperature. The separator plate 166 prevents the portion of the convection heat (e.g., the first convection heat 204) from transferring from the first ampoule 110 to the second ampoule 112, and promotes temperature stabilization for the second temperature of the second ampoule 112, as described above. In some implementations, the second temperature is different from the first temperature.

As further shown in FIG. 9, process 900 may include controlling the second ampoule based on the sensor data (block 930). For example, the controller 122 may control the second ampoule 112 based on the sensor data. The separator plate 166 prevents the portion of the convection heat (e.g., the first convection heat 204) from transferring from the first ampoule 110 to the second ampoule 112, to promote stabilization of an output of the controller 122 for controlling the second ampoule 112, as described above. In some implementations, the separator plate 166 prevents the portion of the convection heat (e.g., the first convection heat 204) from transferring from the first ampoule 110 to the second ampoule 112, and promotes stabilization of an output of the controller 122 for controlling the second ampoule 112.

Process 900 may include additional implementations, such as any single implementation or any combination of implementations described below and/or in connection with one or more other processes described elsewhere herein.

In a first implementation, process 900 includes transmitting a signal (e.g., the actuator control signal 558) to cause an actuator 556 to adjust a position of the separator plate 552 (e.g., the separator plate 166) such that the separator plate 552 is positioned closer to the first ampoule 110 or the second ampoule 112, and the second temperature at the second ampoule 112 varies with the position of the separator plate 552.

In a second implementation, alone or in combination with the first implementation, process 900 includes transmitting a signal (e.g., the actuator control signal 558) to cause an actuator 556 to adjust the separator plate 552 (e.g., the separator plate 166) to be closer to the first ampoule 110 to reduce the second temperature at the second ampoule 112.

In a third implementation, alone or in combination with the first and/or second implementation, the first ampoule 110 generates a first precursor gas 147 at the first temperature. The second ampoule 112 generates a second precursor gas 150 at the second temperature. The first precursor gas 147 and the second precursor gas 150 are used in a same barrier layer deposition operation in a processing chamber 104 of a deposition system 100 in which the dual ampoule system 102 is included.

In a fourth implementation, alone or in combination with any of the first through third implementations, operating the first ampoule 110 at the first temperature in the dual ampoule system 102 includes operating the first ampoule 110 and the second ampoule 112 to concurrently and respectively form the first precursor gas 147 and the second precursor gas 150.

In a fifth implementation, alone or in combination with any of the first through fourth implementations, process 900 includes transmitting a first signal (e.g., the mixer control signal 156) to cause a mixer 154, included in the deposition system, to form a mixed precursor gas 158 from the first precursor gas 147 and the second precursor gas 150, and transmitting a second signal (e.g., the valve control signal 160) to cause a valve to provide the mixed precursor gas 158 to the processing chamber 104.

Although FIG. 9 shows example blocks of process 900, in some implementations, process 900 may include additional blocks, fewer blocks, different blocks, or differently arranged blocks than those depicted in FIG. 9. Additionally, or alternatively, two or more of the blocks of process 900 may be performed in parallel.

In this way, convection transfer between a first ampoule and a second ampoule may be reduced by positioning a separator plate between the first ampoule and the second ampoule (adjacent ampoules), where the first temperature is different than the second temperature. Thus, placement of the separator plate between the first ampoule and the second ampoule reduces convection transfer between the first ampoule and the second ampoule, which provides a reduction in temperature variation (or temperature fluctuation) at a controller for the first ampoule and the second ampoule. The reduction in temperature variation results in greater semiconductor device yields and improved circuit performance on the semiconductor devices. Moreover, the reduction in temperature variation may reduce power consumption of cooling and/or heating components associated with the adjacent ampoules.

As described in greater detail above, some implementations described herein provide a method. The method includes operating, by a controller, a first ampoule at a first temperature in a dual ampoule system, where the dual ampoule system includes: the first ampoule, a second ampoule adjacent to the first ampoule, and a separator plate between the first ampoule and the second ampoule, where the first ampoule emits convection heat as a result of operating at the first temperature, and where the separator plate prevents a portion of the convection heat from transferring from the first ampoule to the second ampoule. The method includes receiving, by the controller, sensor data that is based on a second temperature associated with the second ampoule, where the second temperature is different from the first temperature. The method includes controlling, by the controller, the second ampoule based on the sensor data, where the separator plate preventing the portion of the convection heat from transferring from the first ampoule to the second ampoule promotes stabilization of an output of the controller for controlling the second ampoule.

As described in greater detail above, some implementations described herein provide a dual ampoule system. The dual ampoule system includes a first ampoule. The dual ampoule system includes a second ampoule. The dual ampoule system includes a planar heat shield positioned between the first ampoule and the second ampoule, where the planar heat shield is configured to resist thermal transfer between the first ampoule and the second ampoule. The dual ampoule system includes an adjustable bracket coupled to the planar heat shield at an end of the planar heat shield, where the end extends outward from between the first ampoule and the second ampoule to provide access to the adjustable bracket, and where the adjustable bracket is configured to cause the end of the planar heat shield to be selectively positioned closer to the first ampoule or the second ampoule to adjust convection heat that is transferred between the first ampoule and the second ampoule.

As described in greater detail above, some implementations described herein provide a deposition system. The deposition system includes a processing chamber. The deposition system includes a dual ampoule system including a first ampoule and a second ampoule. The deposition system respectively generates a first precursor gas at a first temperature, and a second precursor gas at a second temperature. The deposition system respectively provides the first precursor gas and the second precursor gas to the processing chamber for use in a same barrier layer deposition operation. In the deposition system, the first temperature is greater than the second temperature. The deposition system includes a separator plate between the first ampoule and the second ampoule. The deposition system partially thermally isolates the second ampoule and the first ampoule. The deposition system resists absorption of convection heat from the first ampoule. The deposition system includes a controller configured to cause the first ampoule to be maintained at the first temperature. The deposition system includes a controller to cause the second ampoule to be maintained at the second temperature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A dual ampoule system, comprising:
- a first ampoule;
- a second ampoule;
- a first hot can above the first ampoule;
- a second hot can above the second ampoule;
- a planar heat shield, positioned between the first ampoule and the second ampoule, comprising a first region and a second region,
  - wherein the planar heat shield is configured to resist thermal transfer between the first ampoule and the second ampoule,
  - wherein the first region is between the first ampoule and the second ampoule, and
  - wherein the second region is between the first hot can and the second hot can and has a width that is less than a width of the first region;
- one or more gas lines extending between the first hot can and the second hot can, wherein the second region is positioned around the one or more gas lines;

an adjustable bracket, coupled to an end of the planar heat shield, configured to allow the planar heat shield to be selectively positioned closer to the first ampoule or the second ampoule, wherein the end of the planar heat shield extends outward from between the first ampoule and the second ampoule to provide access to the adjustable bracket;

a fan, adjacent to at least one of the first ampoule or the second ampoule, configured to generate an airflow around one or more of the first ampoule or the second ampoule; and an exhaust line, located below and between the first ampoule and the second ampoule, configured to receive the airflow.

2. The dual ampoule system of claim 1, wherein the planar heat shield comprises: a material with a thermal conductivity in a range of approximately 0 Watts per meter-Kelvin (W/mK) to approximately 100 W/mK.

3. The dual ampoule system of claim 1, wherein the planar heat shield comprises a material including at least one of: stainless steel, ceramic, glass, or titanium.

4. The dual ampoule system of claim 1, wherein the planar heat shield includes:

a height in a range of approximately 220 millimeters (mm) to approximately 280 mm;

a width in a range of approximately 220 mm to approximately 250 mm; and a thickness in a range of approximately 0.5 mm to approximately 2 mm.

5. The dual ampoule system of claim 1, wherein the end of the planar heat shield is positioned closer to the first ampoule than the second ampoule.

6. The dual ampoule system of claim 1, further comprising:

a first heating element configured to generate heat to cause a temperature of the first ampoule to reach a first ampoule target temperature; and a second heating element configured to generate heat to cause a temperature of the second ampoule to reach a second ampoule target temperature.

7. The dual ampoule system of claim 1, further comprising:

a controller configured to:

cause the first ampoule to be maintained at a first temperature, and cause the second ampoule to be maintained at a second temperature.

8. The dual ampoule system of claim 7, wherein, to cause the first ampoule to be maintained at the first temperature and cause the second ampoule to be maintained at the second temperature, the controller is configured to:

provide a first signal indicative of a first ampoule temperature setpoint associated with the first ampoule, and provide a second signal indicative of a second ampoule temperature setpoint associated with the second ampoule.

9. The dual ampoule system of claim 7, further comprising:

a first sensor associated with the first ampoule; and a second sensor associated with the second ampoule, and wherein the controller is configured to:

receive, from the first sensor, first ampoule sensor data associated with a first ampoule ambient temperature, and receive, from the second sensor, second ampoule sensor data associated with a second ampoule ambient temperature.

10. The dual ampoule system of claim 1, wherein the second region comprises a cut-out region positioned around the one or more gas lines.

11. The dual ampoule system of claim 1, further comprising a fan speed sensor positioned in-line in the exhaust line, wherein the fan speed sensor is configured to generate sensor data for adjusting the airflow through the exhaust line.

12. A deposition system, comprising:

a processing chamber; and a dual ampoule system, including:

a first ampoule and a second ampoule, wherein the first ampoule and the second ampoule are configured to:

respectively generate a first precursor gas at a first temperature, and a second precursor gas at a second temperature, and respectively provide the first precursor gas and the second precursor gas to the processing chamber for use in a same barrier layer deposition operation, wherein the first temperature is greater than the second temperature, a first hot can, above the first ampoule, and a second hot can, above the second ampoule, a fan, adjacent to at least one of the first ampoule or the second ampoule, configured to generate an airflow around one or more of the first ampoule or the second ampoule, an exhaust line, located below and between the first ampoule and the second ampoule, configured to receive the airflow, and a planar heat shield, between the first ampoule and the second ampoule, configured to:

at least partially thermally isolate the second ampoule and the first ampoule, and resist absorption of convection heat from the first ampoule, wherein the planar heat shield comprises a first region, between the first ampoule and the second ampoule, and a second region, between the first hot can and the second hot can, wherein the second region has a width that is less than a width of the first region, and one or more gas lines extending between the first hot can and the second hot can, wherein the second region is positioned around the one or more gas lines.

13. The deposition system of claim 12, wherein the first precursor gas includes a ruthenium (Ru) precursor gas, wherein the second precursor gas includes a tantalum nitride (TaN) precursor gas, and wherein the deposition system further comprises:

a mixer configured to combine the ruthenium precursor gas and the tantalum nitride precursor gas to form a mixed precursor gas for use in the same barrier layer deposition operation for forming a barrier layer that includes ruthenium and tantalum nitride (Ru (TaN)).

14. The deposition system of claim 12, further comprising:

an adjustable bracket coupled to an end of the planar heat shield, wherein the adjustable bracket is configured to permit the end of the planar heat shield to be positioned toward the first ampoule or the second ampoule.

15. The deposition system of claim 12, further comprising:

a cooling element positioned at the second ampoule.

16. The deposition system of claim 12, further comprising a fan speed sensor positioned in-line in the exhaust line, wherein the fan speed sensor is configured to generate sensor data for adjusting the airflow through the exhaust line.

17. A deposition system, comprising:

a processing chamber;

a dual ampoule system, including:

a first ampoule configured to provide a first precursor gas, at a first temperature, to the processing chamber, a second ampoule configured provide a second precursor gas, at a second temperature greater than the first temperature, to the processing chamber, a first hot can, above the first ampoule, and a second hot can, above the second ampoule, a planar heat shield, positioned between the first ampoule and the second ampoule, comprising a first region and a second region, wherein the first region is between the first ampoule and the second ampoule, and wherein the second region is between the first hot can and the second hot can and has a width that is less than a width of the first region;

one or more gas lines extending between the first hot can and the second hot can, wherein the second region is positioned around the one or more gas lines, a fan, adjacent to at least one of the first ampoule or the second ampoule, configured to generate an airflow around one or more of the first ampoule or the second ampoule, and an exhaust line, located below and between the first ampoule and the second ampoule, configured to receive the airflow; and a controller configured to:

cause the first ampoule to be maintained at the first temperature, and cause the second ampoule to be maintained at the second temperature.

18. The deposition system of claim 17, wherein each of the first ampoule and the second ampoule is configured to store a solid or liquid precursor.

19. The deposition system of claim 17, wherein the dual ampoule system further includes:

a first heating element configured to generate heat to cause a temperature of the first ampoule to reach a first ampoule target temperature, and a second heating element configured to generate heat to cause a temperature of the second ampoule to reach a second ampoule target temperature.

20. The deposition system of claim 17, further comprising:

a cooling element configured to cool the second ampoule.

* * * * *